(12) United States Patent
Hayashi et al.

(10) Patent No.: US 7,768,030 B2
(45) Date of Patent: *Aug. 3, 2010

(54) NITRIDE BASED SEMICONDUCTOR DEVICE WITH FILM FOR PREVENTING SHORT CIRCUITING

(75) Inventors: Nobuhiko Hayashi, Osaka (JP); Takashi Kano, Hirakata (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 30 days.

This patent is subject to a terminal disclaimer.

(21) Appl. No.: 12/149,960

(22) Filed: May 12, 2008

(65) Prior Publication Data

US 2009/0114941 A1    May 7, 2009

Related U.S. Application Data

(62) Division of application No. 11/054,956, filed on Feb. 11, 2005, now Pat. No. 7,388,234, which is a division of application No. 09/955,600, filed on Sep. 19, 2001, now Pat. No. 6,872,982, which is a division of application No. 09/361,246, filed on Jul. 27, 1999, now Pat. No. 6,319,742.

(30) Foreign Application Priority Data

Jul. 29, 1998   (JP)  ................................. 10-213970

(51) Int. Cl.
      *H01L 33/44*   (2010.01)
(52) U.S. Cl. .................... 257/99; 257/103; 257/627; 257/E33.025
(58) Field of Classification Search .......... 257/E33.025, 257/E33.033
See application file for complete search history.

(56) References Cited

U.S. PATENT DOCUMENTS 4,546,540 A    10/1985   Ueyanagi et al.

(Continued)

FOREIGN PATENT DOCUMENTS

JP   7-321051 A   12/1995

(Continued)

OTHER PUBLICATIONS

Proceeding of the Second International Conference on Nitride Semiconductor—ICNS '97, Oct. 27-31, pp. 444-446.

(Continued)

*Primary Examiner*—Stephen W Smoot
(74) *Attorney, Agent, or Firm*—Westerman, Hattori, Daniels & Adrian, LLP

(57) ABSTRACT

A GaN layer is grown on a sapphire substrate, an $SiO_2$ film is formed on the GaN layer, and a GaN semiconductor layer including an MQW active layer is then grown on the GaN layer and the $SiO_2$ film using epitaxial lateral overgrowth. The GaN based semiconductor layer is removed by etching except in a region on the $SiO_2$ film, and a p electrode is then formed on the top surface of the GaN based semiconductor layer on the $SiO_2$ film, to join the p electrode on the GaN based semiconductor layer to an ohmic electrode on a GaAs substrate. An n electrode is formed on the top surface of the GaN based semiconductor layer.

8 Claims, 15 Drawing Sheets

U.S. PATENT DOCUMENTS

| | | | |
|---|---|---|---|
| 5,583,880 A | 12/1996 | Shakuda | |
| 5,780,873 A | 7/1998 | Itaya et al. | |
| 6,337,223 B1 | 1/2002 | Kim et al. | |
| 6,377,596 B1 | 4/2002 | Tanaka et al. | |
| 6,500,257 B1 | 12/2002 | Wang et al. | |
| 6,610,995 B2 * | 8/2003 | Nakamura et al. | 257/13 |
| 7,388,234 B2 * | 6/2008 | Hayashi et al. | 257/99 |

FOREIGN PATENT DOCUMENTS

| | | |
|---|---|---|
| JP | 9-8403 A | 1/1997 |
| JP | 09-129984 A | 5/1997 |
| JP | 9-307188 A | 11/1997 |
| JP | 10-41586 A | 2/1998 |
| JP | 11-191658 A | 7/1999 |
| JP | 11-312825 A | 11/1999 |
| WO | WO 97/11518 A1 | 3/1997 |

OTHER PUBLICATIONS

Nikkei Micro Devices, Feb. 1994, pp. 92-93. Discussed at p. 2 of the Specification.

Oyo Buturi, vol. 68. No. 7, 1999. pp. 793-796.

Akira Usui et al., Jpn. J. Appl. Phys. vol. 36 (1997), pp. L899-L902. Part 2, No. 7B. Jul. 15, 1997.

* cited by examiner

F I G. 3
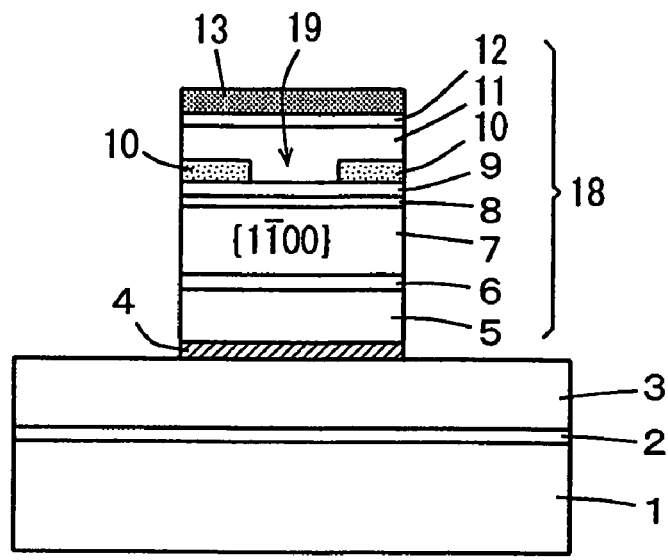
F I G. 4
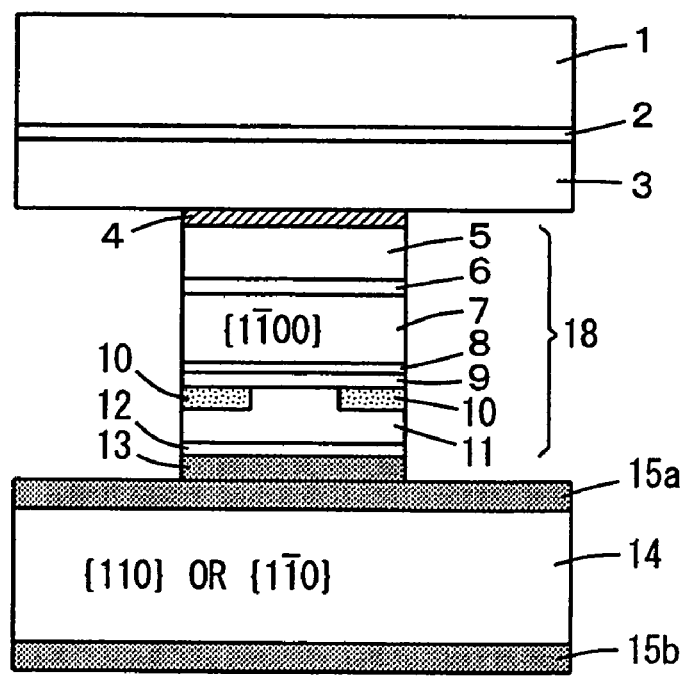

F I G. 1 3
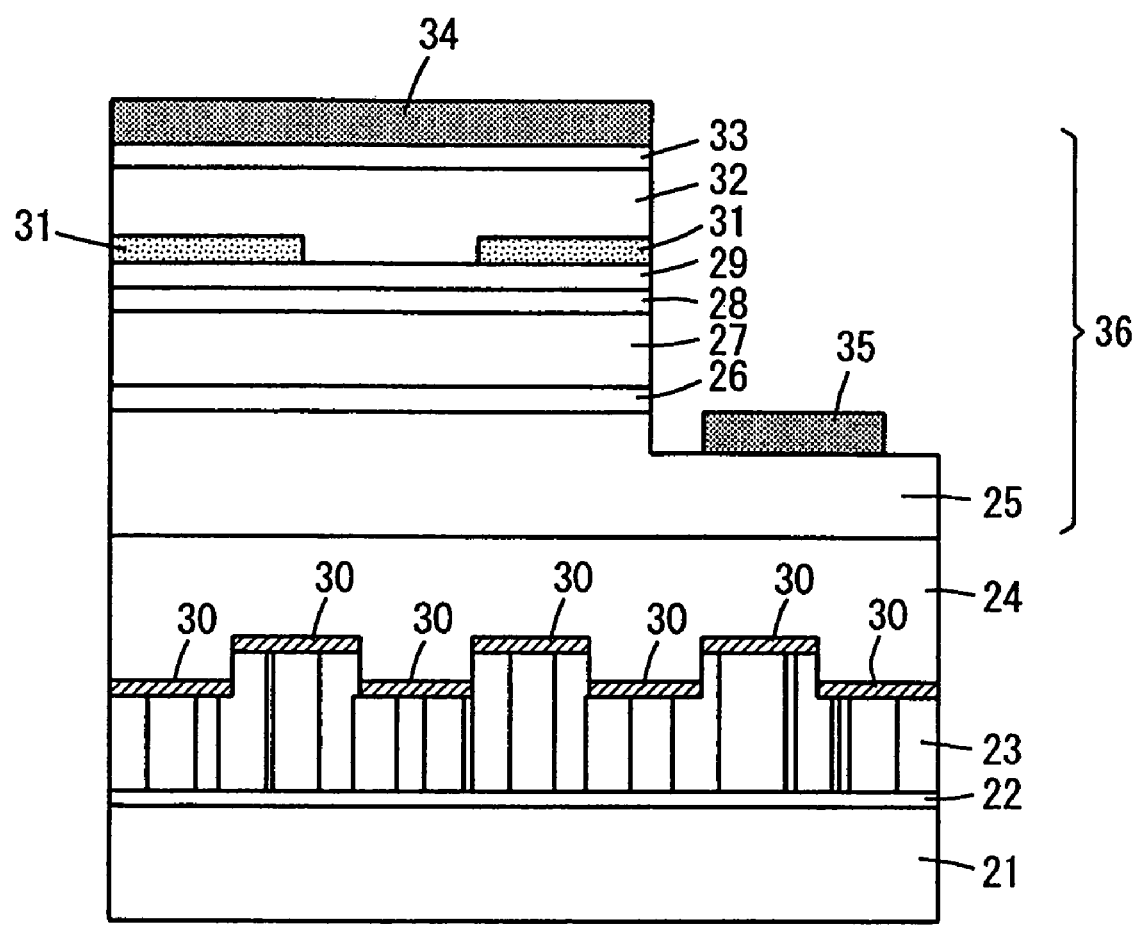

F I G. 1 6
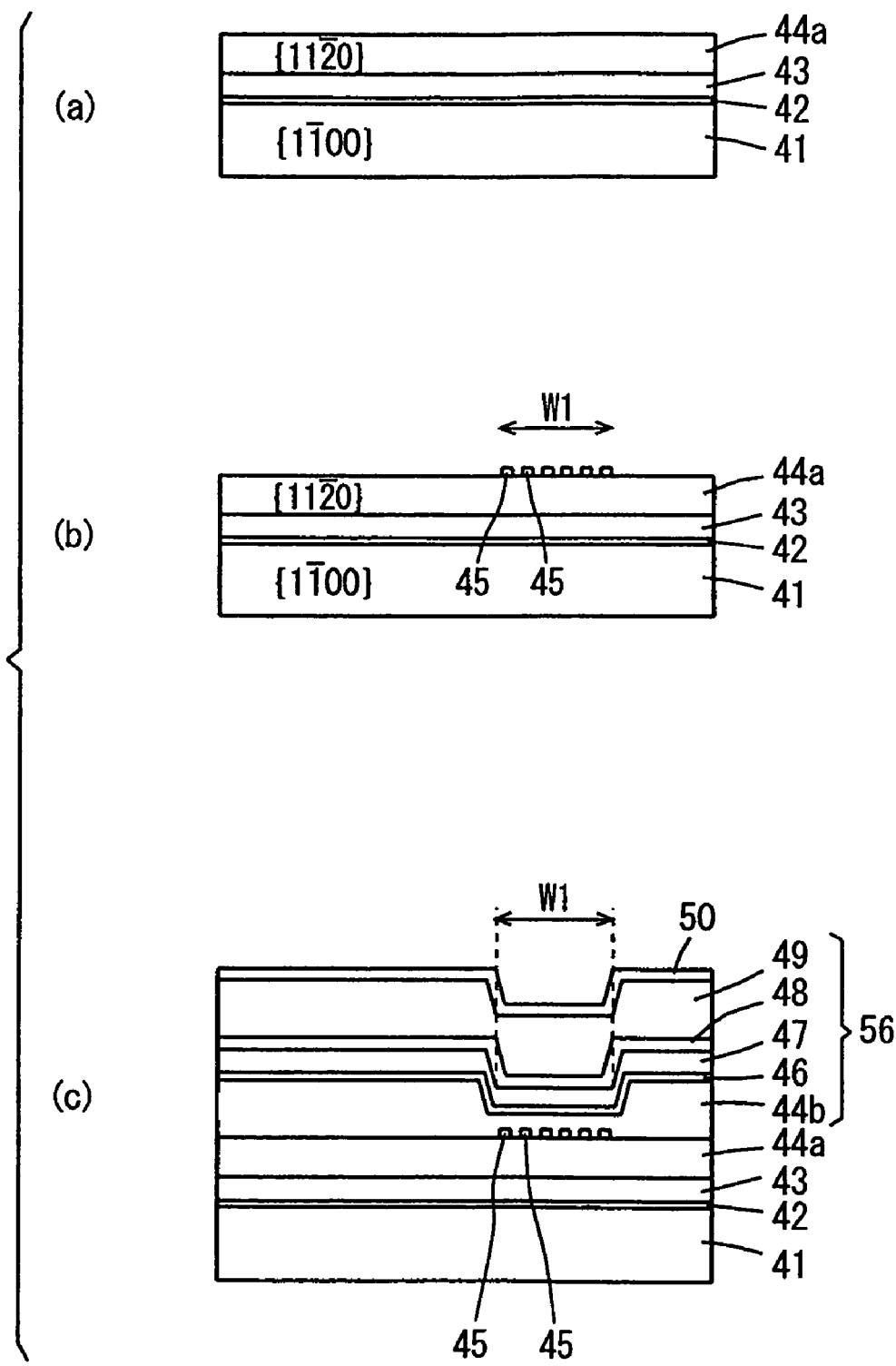

NITRIDE BASED SEMICONDUCTOR DEVICE WITH FILM FOR PREVENTING SHORT CIRCUITING

This application is a divisional of application Ser. No. 11/054,956, filed Feb. 11, 2005, U.S. Pat. No. 7,388,234, which is divisional of application Ser. No. 09/955,600, filed Sep. 19, 2001, U.S. Pat. No. 6,872,982, which is a divisional of application Ser. No. 09/361,246, filed Jul. 27, 1999, U.S. Pat. No. 6,319,742.

BACKGROUND OF THE INVENTION

1. Field of the Invention

The present invention relates to a semiconductor device having a compound semiconductor layer composed of BN (boron nitride), GaN (gallium nitride), AlN (aluminum nitride) or InN (indium nitride) or a group III-V nitride compound semiconductor (hereinafter referred to as a nitride based semiconductor) which is their mixed crystal and a method of fabricating the same, and a method of forming a nitride based semiconductor layer.

2. Description of the Background Art

In recent years, a GaN based light emitting semiconductor device (a light emitting semiconductor device based on GaN) has been put to practical use as a light emitting semiconductor device such as a light emitting diode which emits light in blue or violet or a semiconductor laser device. In fabricating the GaN based light emitting semiconductor device, there exists no substrate composed of GaN.

Therefore, each layer is epitaxially grown on an insulating substrate composed of sapphire ($Al_2O_3$) or the like.

FIG. 18 is a cross-sectional view showing the structure of a conventional GaN based light emitting diode. A light emitting diode shown in FIG. 18 is disclosed in Nikkei Micro Device, February, 1994, pp. 92 to 93.

In FIG. 18, a GaN buffer layer 62, an n-GaN layer 63, an n-AlGaN cladding layer 64, an InGaN active layer 65, a p-AlGaN cladding layer 66, and a p-GaN layer 67 are formed in this order on a sapphire substrate 61. A partial region from the p-GaN layer 67 to the n-GaN layer 63 is removed by etching. A p electrode 68 is formed on the top surface of the p-GaN layer 67, and an n electrode 69 is formed on the exposed top surface of the n-GaN layer 63. Such a structure of the light emitting diode is referred to as a lateral structure.

The light emitting diode shown in FIG. 18 has a pn junction having a double hetero structure in which the InGaN active layer 65 is interposed between the n-AlGaN cladding layer 64 and the p-AlGaN cladding layer 66, and can emit light in blue.

In a conventional GaN based light emitting semiconductor device as shown in FIG. 18, however, dislocations of around $10^9/cm^2$ generally exist in a GaN based semiconductor crystal which is grown on a sapphire substrate depending on the difference in lattice constant between GaN and the sapphire substrate. Such dislocations are propagated from the surface of the sapphire substrate to a GaN based semiconductor layer. In the light emitting semiconductor device composed of the GaN based semiconductor layer on the sapphire substrate, device characteristics and reliability are degraded due to the dislocations.

As a method of solving the problem of the degradation of the device characteristics and the reliability due to the dislocations, epitaxial lateral overgrowth has been proposed. The epitaxial lateral overgrowth is reported in "Proceedings of The Second International Conference on Nitride Semiconductors", Oct. 27-31, 1997, Tokushima, Japan, pp. 444-446.

FIG. 19 is a schematic sectional view showing the steps for explaining the conventional epitaxial lateral overgrowth.

As shown in FIG. 19(a), an AlGaN buffer layer 82 is grown on a sapphire substrate 81, and a GaN layer 83 is formed on the AlGaN buffer layer 82. Dislocations 91 extending in the vertical direction exist in the GaN layer 83. Striped $SiO_2$ films 90 are formed on the GaN layer 83.

As shown in FIG. 19(b), a GaN layer 84 is regrown on the GaN layer 83 exposed between the striped $SiO_2$ films 90. Also in this case, the dislocations 91 extend in the vertical direction in the regrown GaN layer 84.

As shown in FIG. 19(c), when the GaN layer 84 is further grown, the GaN layer 84 is also grown in the lateral direction. Accordingly, the GaN layer 84 is also formed on the $SiO_2$ films 90. No dislocations exist in the GaN layer 84 on the $SiO_2$ films 90.

As shown in FIG. 19(d), when the GaN layer 84 is further grown, the GaN film 84 is formed on the $SiO_2$ films 90 and on the GaN layer 83 between the $SiO_2$ films 90.

When the epitaxial lateral overgrowth is used, a GaN crystal of high quality having no dislocations can be formed on the $SiO_2$ films 90.

In a region where the $SiO_2$ films 90 do not exist, however, the dislocations 91 from the underlying GaN layer 83 extend to the surface of the regrown GaN layer 84. Accordingly, the dislocations still exist on the surface of the GaN layer 84. When the light emitting semiconductor device is fabricated, therefore, a light emitting region must be limited to a region on the $SiO_2$ films. Therefore, it is impossible to increase the size of the light emitting region.

When the area of the $SiO_2$ film is increased in order to increase the area of the GaN layer of high quality, the surface of the GaN layer which is grown in the lateral direction cannot be flattened.

In the conventional GaN based light emitting diode shown in FIG. 18, the sapphire substrate 61 is an insulating substrate. Therefore, the n electrode 69 cannot be provided on the reverse surface of the sapphire substrate 61, and must be provided on the exposed surface of the n-GaN layer 63. Therefore, a current path between the p electrode 68 and the n electrode 69 is longer, so that an operation voltage is higher, as compared with those in a case where the n electrode is provided on the reverse surface of a conductive substrate.

Furthermore, when a GaN based semiconductor laser device is fabricated, it is difficult to form cavity facets by a cleavage method as in a semiconductor laser device for emitting red light or infrared light using a GaAs substrate.

FIG. 20 is a diagram showing the relationship between the crystal orientations of a sapphire substrate and a GaN based semiconductor layer. In FIG. 20, an arrow by a solid line indicates the crystal orientation of the sapphire substrate, and an arrow by a broken line indicates the crystal orientation of the GaN based semiconductor layer.

As shown in FIG. 20, the a-axis and the b-axis of the GaN based semiconductor layer formed on the sapphire substrate are shifted 30° away from the a-axis and the b-axis of the sapphire substrate.

FIG. 21 is a schematic perspective view of a semiconductor laser device composed of a GaN based semiconductor layer formed on a sapphire substrate.

In FIG. 21, a GaN based semiconductor layer 70 is formed on a (0001) plane of a sapphire substrate 61. A striped current injection region 71 is parallel to a <11$\bar{2}$0> direction of the GaN based semiconductor layer 70. In this case, a {1$\bar{1}$00} plane of the GaN based semiconductor layer 70 is inclined at 30° to a {1$\bar{1}$00} plane of the sapphire substrate 61. Both the sapphire substrate 61 and the GaN based semiconductor layer 70 are easily cleaved along the {1$\bar{1}$00} plane.

The respective cleavage directions of the sapphire substrate 61 and the GaN based semiconductor layer 70 thus deviate. When a GaN based semiconductor laser device is fabricated, therefore, it is difficult to form cavity facets by a cleavage method, as in the semiconductor laser device for emitting red light or infrared light which is formed on the GaAs substrate. In this case, the necessity of forming the cavity facets by etching is brought about. When the cavity facets are formed by etching, however, it is impossible to reduce an operation current of the semiconductor laser device because it is difficult to form facets perpendicular to the substrate.

On the other hand, various reports and proposals are made with respect to methods of controlling a transverse mode of the GaN based semiconductor laser device. Almost all of the methods of controlling the transverse mode include two types, i.e., a ridge waveguided structure and a self-aligned structure which are employed by the conventional semiconductor laser device for emitting red light or infrared light.

Since the GaN based semiconductor layer is chemically stable, however, it cannot be patterned by wet etching, unlike an AlGaAs based semiconductor layer used for the conventional semiconductor laser device emitting red light or infrared light, and must be patterned by dry etching such as RIE (Reactive Ion Etching) or RIBE (Reactive Ion Beam Etching).

In the GaN based semiconductor laser device, therefore, the patterning for fabricating the ridge waveguided structure or the self-aligned structure cannot be performed easily and with good reproducibility. Moreover, device characteristics greatly vary depending on the precision of the dry etching.

SUMMARY OF THE INVENTION

An object of the present invention is to provide a nitride based semiconductor device (a semiconductor device based on a nitride) capable of performing a low-voltage operation.

Another object of the present invention is to provide a nitride based light emitting semiconductor device capable of performing a low-voltage operation and forming a facet by cleavage.

Still another object of the present invention is to provide a method of fabricating a nitride based semiconductor device in which the number of dislocations is reduced, a low-voltage operation can be performed, and a facet can be formed by cleavage.

Still another object of the present invention is to provide a method of forming a nitride based semiconductor layer (a semiconductor layer based on a nitride) of high quality having no dislocations in a wide region on a substrate.

Still another object of the present invention is to provide a semiconductor device composed of a nitride based semiconductor layer of high quality having no dislocations in a wide region on a substrate.

Still another object of the present invention is to provide a light emitting semiconductor device having an active layer of high quality having no dislocations in a wide region on a substrate.

Still another object of the present invention is to provide a nitride based semiconductor device capable of fabricating an active region of the device of high quality without using etching.

Still another object of the present invention is to provide a refractive index guided nitride based light emitting semiconductor device capable of forming an optical waveguide path of high quality without using etching.

Still another object of the present invention is to provide a method of fabricating a nitride based semiconductor device capable of fabricating an active region of the device of high quality without using etching.

A semiconductor device according to one aspect of the present invention comprises a gallium arsenide substrate, a first electrode layer formed on the gallium arsenide substrate, a nitride based semiconductor layer formed on the first electrode layer and containing at least one of boron, gallium, aluminum and indium, and a second electrode layer formed on the nitride based semiconductor layer.

In the semiconductor device, the first electrode layer and the second electrode layer are respectively provided on the bottom surface and the top surface of the nitride based semiconductor layer on the gallium arsenide substrate. Accordingly, a current path between the first electrode layer and the second electrode layer is shortened. Consequently, it is possible to reduce an operation voltage of the nitride based semiconductor device.

The nitride based semiconductor layer may include an active layer. In this case, the first electrode layer and the second electrode layer are respectively provided on the bottom surface and the top surface of the nitride based semiconductor layer on the gallium arsenide substrate. Accordingly, the current path between the first electrode layer and the second electrode layer is shortened. Consequently, it is possible to reduce the operation voltage of the nitride based light emitting semiconductor device.

Particularly, it is preferable that the nitride based semiconductor layer has a striped current injection region for injecting a current into the active layer, the striped current injection region is formed along a <1$\bar{1}$00> direction of the nitride based semiconductor layer, the nitride based semiconductor layer is arranged on the gallium arsenide substrate such that the <1$\bar{1}$00> direction of the nitride based semiconductor layer coincides with a <110> direction or a <1$\bar{1}$0> direction of the gallium arsenide substrate, and a pair of cavity facets is formed of a {110} plane or a {1$\bar{1}$0} plane of the gallium arsenide substrate and a {1$\bar{1}$00} plane of the nitride based semiconductor layer.

In this case, the cleavage direction of the nitride based semiconductor layer and the cleavage direction of the gallium arsenide substrate coincide with each other. Accordingly, the cavity facets can be formed by the cleavage. Therefore, a semiconductor laser device is realized as a light emitting semiconductor device. Further, the uniformity of device characteristics is improved, and the reproducibility of the device characteristics is increased.

A method of fabricating a semiconductor device according to another aspect of the present invention comprises the steps of forming a first nitride based semiconductor layer containing at least one of boron, gallium, aluminum and indium on an insulating substrate, forming an insulating film in a predetermined region on the first nitride based semiconductor layer, forming a second nitride based semiconductor layer containing at least one of boron, gallium, aluminum and indium using epitaxial lateral overgrowth on the first nitride based semiconductor layer and the insulating film, removing the second nitride based semiconductor layer except in a region on the insulating film, joining the top surface of the second nitride based semiconductor layer on the insulating film to one surface of a gallium arsenide substrate through a first electrode layer, removing the insulating film, to remove the insulating substrate and the first nitride based semiconductor layer from the second nitride based semiconductor layer, and forming a second electrode layer on the second nitride based semiconductor layer.

In the method of fabricating the semiconductor device, the second nitride based semiconductor layer is formed using the epitaxial lateral overgrowth on the insulating film on the first nitride based semiconductor layer. Accordingly, no dislocations are propagated to the second nitride based semiconductor layer on the insulating film from the first nitride based semiconductor layer. Consequently, a second nitride based semiconductor layer of high quality having few dislocations is obtained.

The first electrode layer and the second electrode layer are respectively provided on the bottom surface and the top surface of the second nitride based semiconductor layer on the gallium arsenide substrate. Accordingly, a current path between the first electrode layer and the second electrode layer is shortened. Consequently, an operation voltage can be reduced.

Furthermore, when the top surface of the second nitride based semiconductor layer is joined to one surface of the gallium arsenide substrate through the first electrode layer, the crystal orientations of the second nitride based semiconductor layer and the gallium arsenide substrate can be matched with each other. Accordingly, a facet of the semiconductor device can be formed by cleavage. Consequently, the uniformity of device characteristics is improved, and the reproducibility of the device characteristics is increased.

Particularly, the step of forming the second nitride based semiconductor layer may comprise the step of forming an active layer. Consequently, a light emitting semiconductor device is fabricated as the semiconductor device.

Furthermore, the step of forming the second nitride based semiconductor layer may further comprise the step of forming a striped current injection region for injecting a current into the active layer along a <1$\bar{1}$00> direction of the second nitride based semiconductor layer, and the step of joining the top surface of the second nitride based semiconductor layer to one surface of the gallium arsenide substrate through the first electrode layer may comprise the step of matching the <1$\bar{1}$00> direction of the second nitride based semiconductor layer with a <110> direction or a <1$\bar{1}$0> direction of the gallium arsenide substrate. The fabricating method may further comprise the step of forming a pair of cavity facets by cleavage along a {110} plane or a {1$\bar{1}$0} plane of the gallium arsenide substrate and a {1$\bar{1}$00} plane of the second nitride based semiconductor layer.

In this case, the cleavage direction of the nitride based semiconductor layer and the cleavage direction of the gallium arsenide substrate coincide with each other. Accordingly, the cavity facets can be formed by the cleavage. Consequently, a semiconductor laser device is realized as the light emitting semiconductor device. Further, the device characteristics hardly vary, and the reproducibility of the device characteristics is increased.

A method of forming a nitride based semiconductor layer according to still another aspect of the present invention comprises the steps of forming a first nitride based semiconductor layer containing at least one of boron, gallium, aluminum and indium on an insulating substrate, forming an irregular pattern including a recess having a bottom surface formed of an insulator and a projection having a top surface formed of an insulator in the surface of the first nitride based semiconductor layer, and forming a second nitride based semiconductor layer containing at least one of boron, gallium, aluminum and indium on the insulators by growth from the first nitride based semiconductor layer using epitaxial lateral overgrowth.

In the method of forming the nitride based semiconductor layer, the insulators are formed on the bottom surface of the recess in the irregular pattern formed on the surface of the first nitride based semiconductor layer and the top surface of the projection in the irregular pattern. Accordingly, the first nitride based semiconductor layer is exposed to only side surfaces of the irregular pattern. Therefore, the second nitride based semiconductor layer is formed on the insulators by the growth in the lateral direction of the nitride based semiconductor layer. Consequently, no dislocations are propagated to the second nitride based semiconductor layer from the first nitride based semiconductor layer. As a result, a nitride based semiconductor layer of high quality having no dislocations is formed in a wide region on the substrate. The step of forming the irregular pattern may comprise the steps of forming the irregular pattern such that the first nitride based semiconductor layer is exposed to the bottom surface of the recess, and forming an insulating film as the insulator on the bottom surface of the recess of the irregular pattern and forming an insulating film as the insulator on the top surface of the projection of the irregular pattern.

Alternatively, the step of forming the irregular pattern may comprise the step of forming an insulating film as the insulator in a region on the first nitride based semiconductor layer where the projection of the irregular pattern is to be formed and removing the first nitride based semiconductor such that the insulating substrate is exposed as the insulator except in a region on the insulating film.

Particularly, it is preferable that the irregular pattern has a striped recess and a striped projection which extend along a <11$\bar{2}$0> direction of the first nitride based semiconductor layer. Consequently, the nitride based semiconductor layer is easily grown in the lateral direction.

It is preferable that a cross-sectional shape of the projection of the irregular pattern is a rectangular shape or a reversed mesa shape having vertical side surfaces. When the insulating films are deposited on the irregular pattern, therefore, the insulating films can be formed only on the bottom surface of the recess in the irregular pattern and the top surface of the projection in the irregular pattern. Therefore, it is possible to omit the step of removing the insulating films on the side surfaces of the irregular pattern.

A semiconductor device according to still another aspect of the present invention comprises an insulating substrate, a first nitride based semiconductor layer formed on the insulating substrate and containing at least one of boron, gallium, aluminum and indium, an irregular pattern being formed in the surface of the first nitride based semiconductor layer, insulating films respectively formed on the bottom surface of a recess and the top surface of a projection of the irregular pattern of the first nitride based semiconductor layer, and a second nitride based semiconductor layer formed on the insulating films and containing at least one of boron, gallium, aluminum and indium.

In the semiconductor device, the insulating films are respectively formed on the bottom surface of the recess in the irregular pattern on the surface of the first nitride based semiconductor layer and the top surface of the projection in the irregular pattern, and the second nitride based semiconductor layer is formed on the insulating films. Accordingly, no dislocations are propagated to the second nitride based semiconductor layer from the first nitride based semiconductor layer. Consequently, a nitride based semiconductor device of high quality having no dislocations is realized in a wide region on the substrate.

The second nitride based semiconductor layer may include an active layer. In this case, the insulating films are respectively formed on the bottom surface of the recess in the irregular pattern on the surface of the first nitride based semiconductor layer and the top surface of the projection in the irregular pattern, and the second nitride based semiconductor layer is formed on the insulating films. Accordingly, no dislocations are propagated to the second nitride based semiconductor layer from the first nitride based semiconductor layer. Consequently, a nitride based semiconductor device including an active layer of high quality having no dislocations is realized in the wide region on the substrate.

A semiconductor device according to still another aspect of the present invention comprises an insulating substrate, a first nitride based semiconductor layer formed on the insulating substrate and containing at least one of boron, gallium, aluminum and indium, a plurality of striped insulating films formed a predetermined distance away from each other on the first nitride based semiconductor layer, and a second nitride based semiconductor layer formed on the first nitride based semiconductor layer and the plurality of striped insulating films and containing at least one of boron, gallium, aluminum and indium. The second nitride based semiconductor layer includes an active region of the device above the plurality of striped insulating films. The active region is an actually operating region other than an electrode forming region of the semiconductor device.

In the semiconductor device, the second nitride based semiconductor layer is formed on the first nitride based semiconductor layer through the plurality of striped insulating films. Accordingly, few dislocations exist in the second nitride based semiconductor layer on a region where the plurality of striped insulating films exist. Consequently, the active region of the device above the plurality of striped insulating films is increased in quality.

On the region where the plurality of striped insulating films exist, the growth rate of the second nitride based semiconductor layer is lower, as compared with that on the region where the plurality of striped insulating films do not exist. Consequently, the second nitride based semiconductor layer on the region where the plurality of striped insulating films exist is concavely formed. Consequently, it is possible to fabricate the active region of the device without using etching.

The active region may include a light emitting portion. In this case, the second nitride based semiconductor layer is formed on the first nitride based semiconductor layer through the plurality of striped insulating films. Accordingly, few dislocations exist in the second nitride based semiconductor layer on the region where the plurality of striped insulating films exist. Consequently, the light emitting portion above the plurality of striped insulating films is increased in quality.

On the region where the plurality of striped insulating films exist, the growth rate of the second nitride based semiconductor layer is lower, as compared with that on the region where the plurality of striped insulating films do not exist. Consequently, the second nitride based semiconductor layer on the region where the plurality of striped insulating films exist is concavely formed. Consequently, it is possible to fabricate a refractive index guided optical waveguide path without using etching.

Particularly, the second nitride based semiconductor layer may have a striped current injection region for injecting a current into the light emitting portion, and the second nitride based semiconductor layer may comprise a pair of cavity facets perpendicular to the striped current injection region. Consequently, the current is injected in a stripe shape into the light emitting portion, thereby making lasing possible.

It is preferable that the plurality of striped insulating films are formed along a <1 1$\bar{2}$0> direction of the first nitride based semiconductor layer. Consequently, the nitride based semiconductor layer is easily grown in the lateral direction, and the second nitride based semiconductor layer is made higher in quality.

A method of fabricating a semiconductor device according to still another aspect of the present invention comprises the steps of forming a first nitride based semiconductor layer containing at least one of boron, gallium, aluminum and indium on an insulating substrate, forming a plurality of striped insulating films a predetermined distance away from each other on the first nitride based semiconductor layer, and forming a second nitride based semiconductor layer containing at least one of boron, gallium, aluminum and indium using epitaxial lateral overgrowth on the first nitride based semiconductor layer and the plurality of striped insulating films, to form an active region of the device above the plurality of striped insulating films. The active region is an actually operating region other than an electrode forming region of the semiconductor device.

In the method of fabricating the semiconductor device, the second nitride based semiconductor layer is formed using epitaxial lateral overgrowth through the plurality of striped insulating films on the first nitride based semiconductor layer. Accordingly, few dislocations exist in the second nitride based semiconductor layer on the region where the plurality of striped insulating films exist. Consequently, the active region of the device above the plurality of striped insulating films is increased in quality.

On the region where the plurality of striped insulating films exist, the growth rate of the second nitride based semiconductor layer is lower, as compared with that on the region where the plurality of striped insulating films do not exist. Consequently, the second nitride based semiconductor layer on the region where the plurality of striped insulating films exist is concavely formed. Consequently, it is possible to fabricate an active layer of the device without using etching.

A method of forming a nitride based semiconductor layer according to still another aspect of the present invention comprises the steps of forming a first nitride based semiconductor layer containing at least one of boron, gallium, aluminum and indium on an insulating substrate, forming an irregular pattern having exposed side surfaces in the first nitride based semiconductor layer, and forming a second nitride based semiconductor layer containing at least one of boron, gallium, aluminum and indium on the irregular pattern by growth from the exposed side surfaces of the irregular pattern on the first nitride based semiconductor layer using epitaxial lateral overgrowth.

In the method of forming the nitride based semiconductor layer, the side surfaces of the irregular pattern formed in the first nitride based semiconductor layer are exposed. Therefore, the second nitride based semiconductor layer is formed on the irregular pattern by growth in the lateral direction of the nitride based semiconductor layer from the exposed side surfaces. Consequently, no dislocations are propagated to the second nitride based semiconductor layer from the first nitride based semiconductor layer. As a result, a nitride based semiconductor layer of high quality having no dislocations is formed in a wide region on the substrate.

The step of forming the irregular pattern may comprise the steps of forming the irregular pattern such that the first nitride based semiconductor layer is exposed to the bottom surface of a recess, and forming insulating films on the bottom surface of the recess of the irregular pattern and the top surface of the projection of the irregular pattern.

Alternatively, the step of forming the irregular pattern may comprise the step of forming an insulating film in a region on the first nitride based semiconductor layer where the projection in the irregular pattern is to be formed, and removing the first nitride based semiconductor such that the insulating substrate is exposed except in a region on the insulating film.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a schematic sectional view showing the steps of the method of fabricating the semiconductor laser device in the first embodiment of the present invention;

FIG. 4 is a schematic sectional view showing the steps of the method of fabricating the semiconductor laser device in the first embodiment of the present invention;

FIG. 13 is a schematic sectional view showing an example of a semiconductor laser device fabricated on the GaN layer formed by the method shown in FIGS. 9 and 10;

FIG. 16 is a schematic sectional view showing the steps of a method of fabricating a semiconductor laser device in a third embodiment of the present invention;

DESCRIPTION OF THE PREFERRED EMBODIMENTS

FIGS. 1 to 6 are schematic sectional views showing the steps of a method of fabricating a semiconductor laser device in a first embodiment of the present invention.

Figure 1:
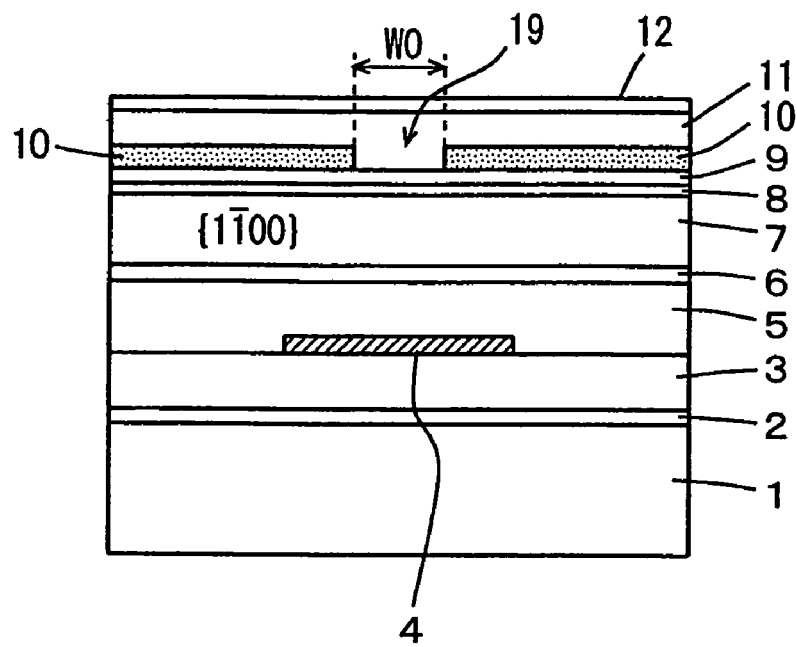
FIG. 1 is a schematic sectional view showing the steps of a method of fabricating a semiconductor laser device in a first embodiment of the present invention.

As shown in FIG. 1, an AlGaN buffer layer 2 is first formed on a sapphire substrate 1, and an undoped GaN layer 3 is grown on the AlGaN buffer layer 2. An $SiO_2$ film 4 having a predetermined width is formed on the GaN layer 3, and an n-GaN layer 5 is then grown on the GaN layer 3 and the $SiO_2$ film 4 using epitaxial lateral overgrowth.

An n-$In_P Ga_{1-P}N$ (P=0.1) crack preventing layer 6 having a thickness of 0.1 μm, an n-$Al_Y Ga_{1-Y}N$ (Y=0.07) cladding layer 7 having a thickness of 1.0 μm, a multi quantum well active layer (hereinafter referred to as an MQW active layer) 8 described later, a p-$Al_Y Ga_{1-Y}N$ (Y=0.07) cladding layer 9 having a thickness of 0.15 μm, and an n-$Al_Z Ga_{1-Z}N$ (Z=0.12) current blocking layer 10 having a thickness of 0.20 μm are then formed in this order on the n-GaN layer 5.

Figure 7:
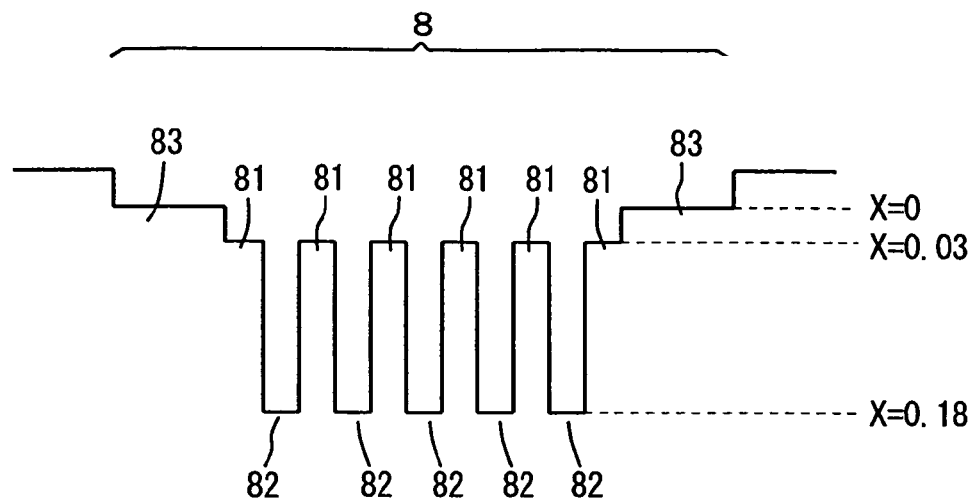
FIG. 7 is a diagram showing an energy band structure of an MQW active layer in the semiconductor laser device shown in FIGS. 1 to 6.

FIG. 7 is a diagram showing an energy band structure of the MQW active layer 8. As shown in FIG. 7, the MQW active layer 8 includes a multi quantum well structure obtained by alternately laminating six $In_X Ga_{1-X}N$ (X=0.03) quantum barrier layers 81 having a thickness of 60 Å and five $In_X Ga_{1-X}N$ (X=0.10) quantum well layers 82 having a thickness of 30 Å. Both surfaces of the multi quantum well structure are interposed between GaN optical guide layers 83 having a thickness of 0.1 μm.

A striped region having a width WO at the center of the n-$Al_Z Ga_{1-Z}N$ current blocking layer 10 is then removed by etching. In this case, the striped region between the n-$Al_Z Ga_{1-Z}N$ current blocking layers 10 is a current injection region 19. The width WO of the current injection region 19 is 2 μm, for example. The current injection region 19 is formed in a <11$\bar{2}$0> direction of GaN.

Furthermore, a p-$Al_Y Ga_{1-Y}N$ (Y=0.07) cladding layer 11 having a thickness of 0.4 μm and a p-GaN contact layer 12 having a thickness of 0.1 μm are formed in this order on the n-$Al_Z Ga_{1-Z}N$ current blocking layer 10 and the p-$Al_Y Ga_{1-Y}N$ cladding layer 9.

Si is used as an n-type dopant, and Mg is used as a p-type dopant. Examples of a method of growing each layer include MOCVD (Metal Organic Chemical Vapor Deposition) or HVPE (Hydride Vapor Phase Epitaxy).

In this case, dislocations extend in the vertical direction from the GaN layer 3 to the p-GaN contact layer 12 in a region where the $SiO_2$ film 4 does not exist. No dislocations exist from the n-GaN layer 5 to the p-GaN contact layer 12 on the $SiO_2$ film 4.

Figure 2:
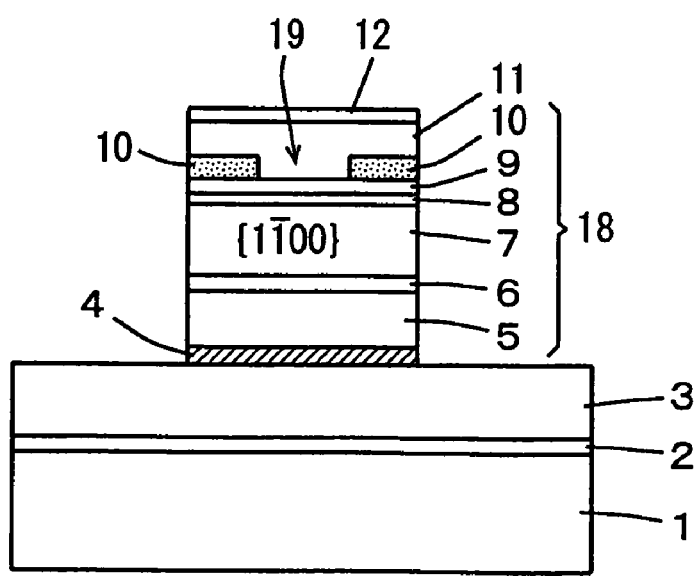
FIG. 2 is a schematic sectional view showing the steps of the method of fabricating the semiconductor laser device in the first embodiment of the present invention.

As shown in FIG. 2, the region, from the p-GaN contact layer 12 to the n-GaN layer 5, where the $SiO_2$ film 4 does not exist are removed by dry etching such as RIE or RIBE. Consequently, a GaN based semiconductor layer 18 having no dislocations remains on the GaN layer 3.

Furthermore, in order to activate the p-type dopant, a p electrode 13 composed of Ni having a thickness of 5000 Å, Pt having a thickness of 100 Å, and Au having a thickness of 1 µm is formed on the p-GaN contact layer 12, as shown in FIG. 3, after annealing at a temperature over 600° C., for example, at 800° C. for 30 minutes.

As shown in FIG. 4, an n-GaAs substrate 14 of 100 µm thickness having ohmic electrodes 15a and 15b formed on its top and reverse surfaces of (001) planes is prepared. The top surface of the p electrode 13 formed on the GaN based semiconductor layer 18 on the sapphire substrate 1 is joined by thermocompression (bonding) or fusion to the ohmic electrode 15a on the n-GaAs substrate 14.

When the thermocompression is used, it is desirable that the surface of the p electrode 13 and the surface of the ohmic electrode 15a are covered with Au in a state immediately after evaporation. When the fusion is used, it is desirable that an Au-Sn film having a thickness of approximately 3 µm is formed on the n-GaAs substrate 14.

Figure 8:
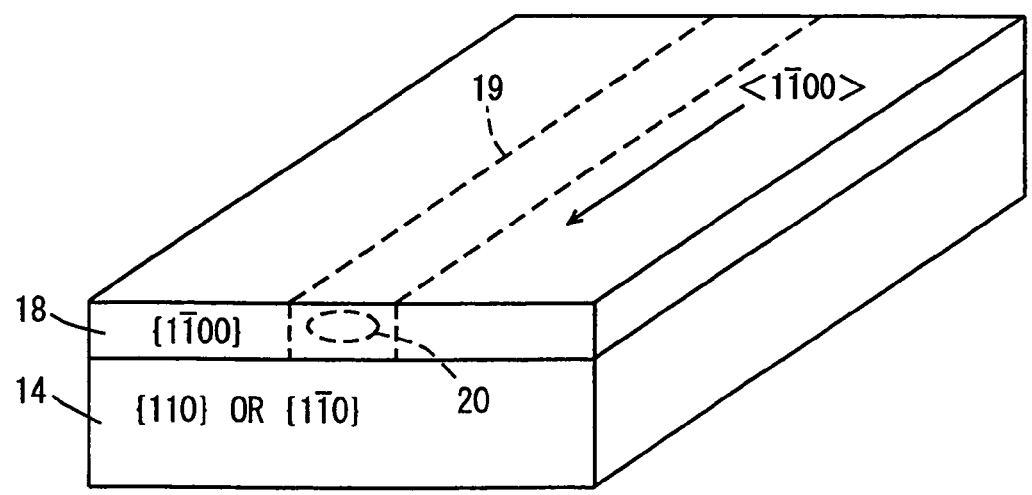
FIG. 8 is a perspective view showing the relationship between the crystal orientations of a sapphire substrate and a GaN based semiconductor layer in the semiconductor laser device shown in FIGS. 1 to 6.

In joining the p electrode 13 and the ohmic electrode 15a, the respective crystal orientations of the GaAs substrate 14 and the GaN based semiconductor layer 18 are matched with each other such that the n-GaAs substrate 14 and the GaN based semiconductor layer 18 have a relationship shown in FIG. 8.

In FIG. 8, the GaN based semiconductor layer 18 is formed on a (001) plane of the n-GaAs substrate 14. A striped current injection region 19 corresponds to a region between the n-$Al_zGa_{1-z}N$ current blocking layers 10 shown in FIG. 4, and a light emitting portion 20 is formed in the current injection region 19. The current injection region 19 is provided in a <1$\bar{1}$00> direction. In this case, the GaN based semiconductor layer 18 is joined to the n-GaAs substrate 14 such that the current injection region 19 in the GaN based semiconductor layer 18 is parallel to a <110> direction or a <1$\bar{1}$0> direction of the n-GaAs substrate 14.

Figure 5:
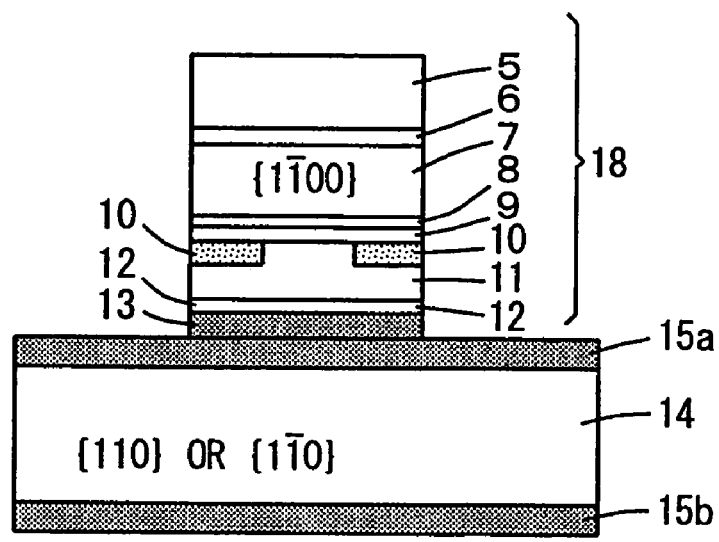
FIG. 5 is a schematic sectional view showing the steps of the method of fabricating the semiconductor laser device in the first embodiment of the present invention.
Figure 6:
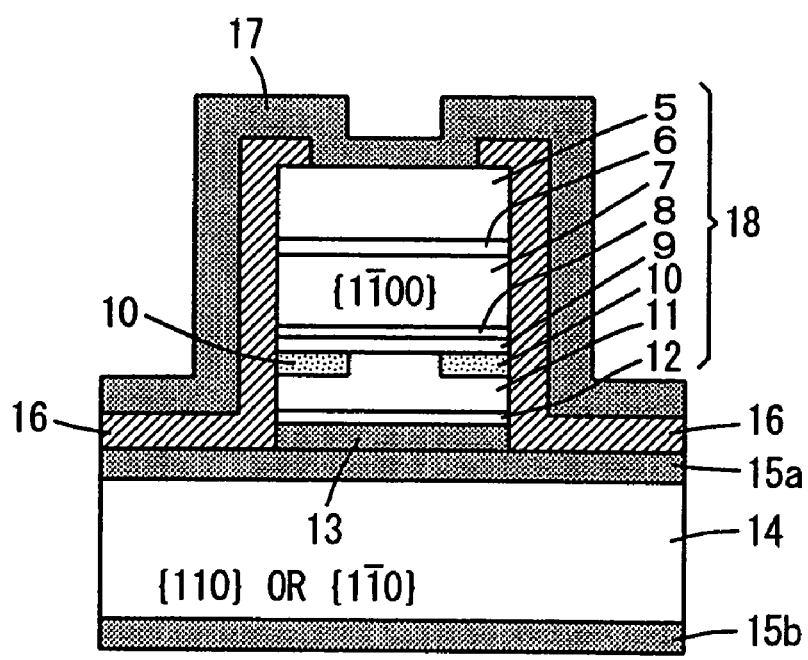
FIG. 6 is a schematic sectional view showing the steps of the method of fabricating the semiconductor laser device in the first embodiment of the present invention.

The sapphire substrate 1 and the n-GaAs substrate 14 shown in FIG. 4 are then dipped in a raw hydrofluoric acid, to remove the $SiO_2$ film 4. The sapphire substrate 1 and the AlGaN buffer layer 2 and the GaN layer 3, having the dislocations, on the sapphire substrate 1 are removed from the GaN based semiconductor layer 18 on the n-GaAs substrate 14 by lift-off. Consequently, the GaN based semiconductor layer 18 having no dislocations remains on the n-GaAs substrate 14, as shown in FIG. 5. In this case, it is desirable that a raw hydrofluoric acid containing a surface active agent is used such that side etching of the $SiO_2$ film 4 easily progresses.

Finally, as shown in FIG. 6a, an $SiO_2$ film 16 for preventing short is formed on the top surface and side surfaces of the GaN based semiconductor layer 18 and the surface of the ohmic electrode 15a except in a region at the center of the n-GaN layer 5, and an n electrode 17 composed of Ti having a thickness of 100 Å and Al having a thickness of 2000 Å is formed on the n-GaN layer 5 and the $SiO_2$ film 16.

Thereafter, a pair of cavity facets is formed by a cleavage method. In this case, a {1$\bar{1}$00} plane of the GaN based semiconductor layer 18 and a {110} plane or a {1$\bar{1}$0} plane of the n-GaAs substrate 14 are cleavage planes, as shown in FIG. 8.

In the semiconductor laser device according to the present embodiment, the p electrode 13 and the n electrode 17 are respectively formed on the reverse surface and the surface of the GaN based semiconductor layer 18. Accordingly, a current path between the p electrode 13 and the n electrode 17 is shortened. Further, few dislocations exist in the GaN based semiconductor layer 18. Consequently, a low-voltage operation and a low-current operation are possible.

The cleavage direction of the GaN based semiconductor layer 18 and the cleavage direction of the n-GaAs substrate 14 can be matched with each other. Accordingly, the cavity facets can be easily formed by the cleavage method.

Although in the present embodiment, description was made of a case where the present invention is applied to the semiconductor laser device, the present invention is also applicable to light emitting semiconductor devices such as a light emitting diode and an other semiconductor devices.

Figure 9:
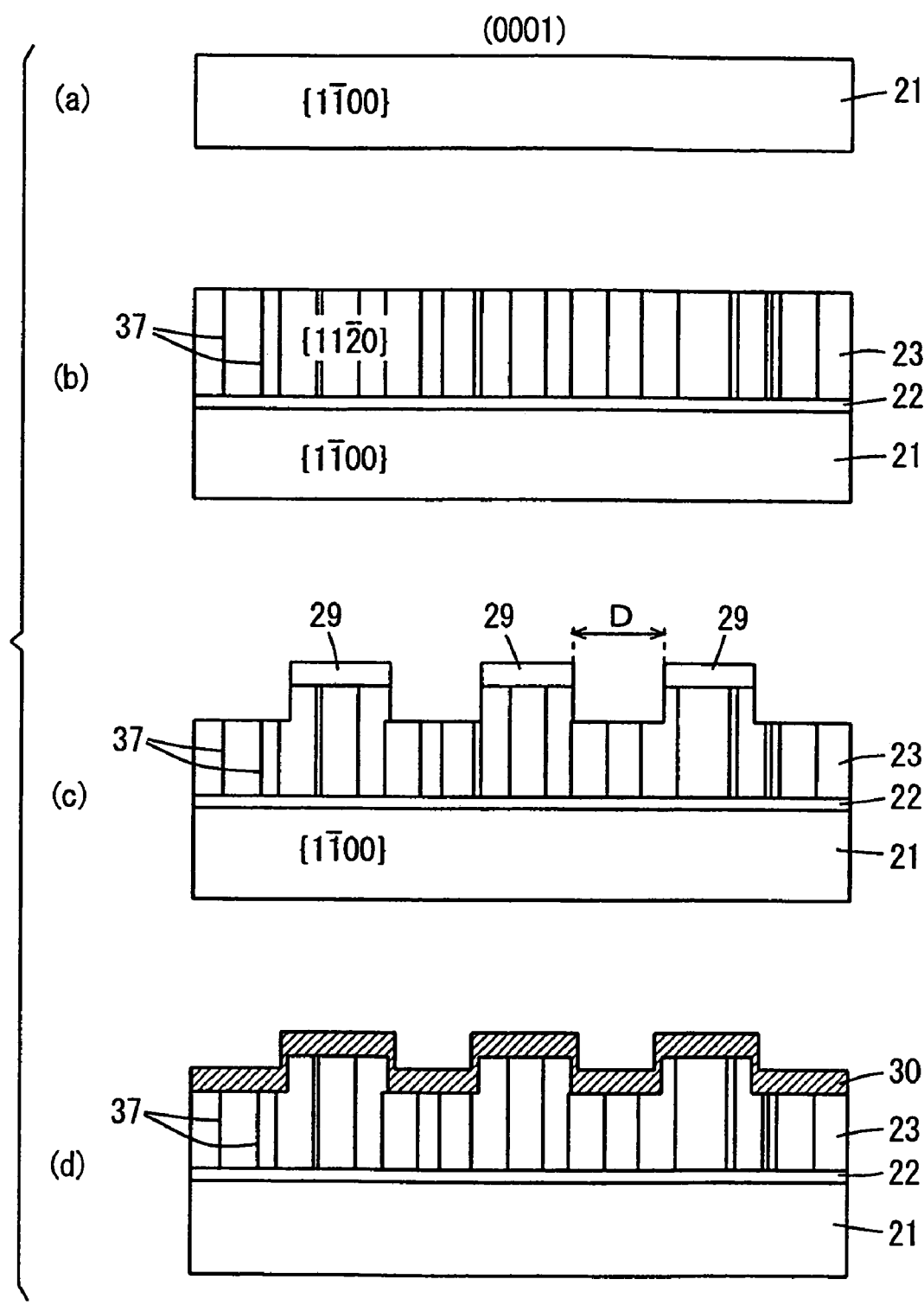
FIG. 9 is a schematic sectional view showing the steps of a method of forming a GaN based semiconductor layer in a second embodiment of the present invention.
Figure 10:
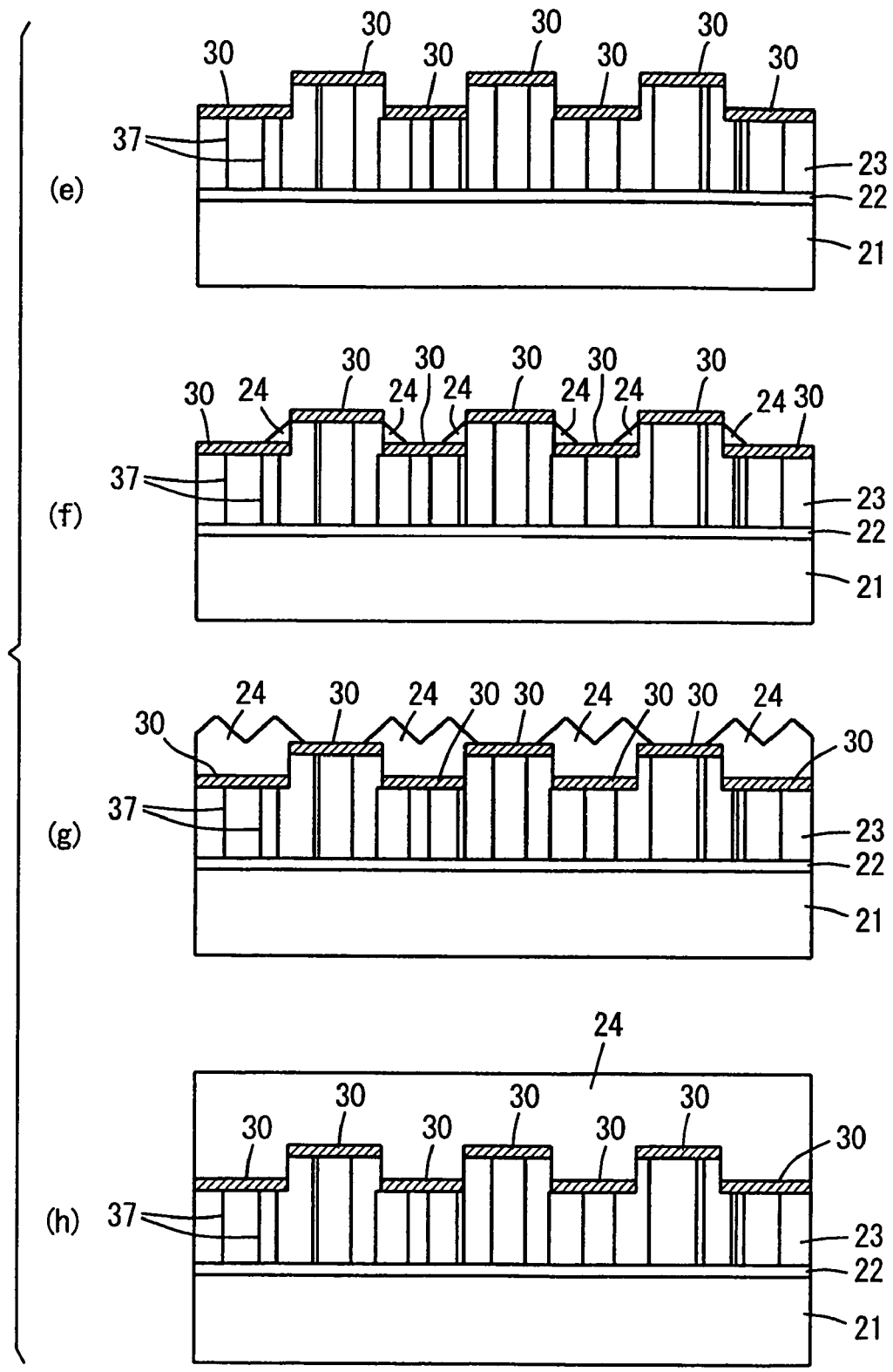
FIG. 10 is a schematic sectional view showing the steps of the method of forming the GaN based semiconductor layer in the second embodiment of the present invention.

FIGS. 9 and 10 are schematic sectional views showing the steps of a method of forming a GaN based semiconductor layer in a second embodiment of the present invention.

The top surface of a sapphire substrate 21 shown in FIG. 9(a) has a (0001) plane (c face). As shown in FIG. 9(b), an AlGaN buffer layer 22 and an undoped GaN layer 23 are grown in this order on the (0001) plane of the sapphire substrate 21. Dislocations 37 extending in the vertical direction exist in the GaN layer 23.

As shown in FIG. 9(c), the GaN layer 23 is then etched by RIE using striped masks 29 composed of Ni, to form a striped irregular pattern on the surface of the GaN layer 23. The respective widths D of a recess and a projection in the irregular pattern shall be 5 µm, for example.

After the striped masks 29 are removed, an $SiO_2$ film 30 is then formed on the GaN layer 23, as shown in FIG. 9(d).

As shown in FIG. 10(e), the $SiO_2$ film 30 formed on side surfaces of the irregular pattern on the GaN layer 23 is then removed by etching.

Thereafter, as shown in FIG. 10(f), a GaN layer 24 is regrown. At this time, the underlying GaN layer 23 is exposed only to the side surfaces of the irregular pattern. When the regrowth of the GaN layer 24 is started, therefore, the GaN layer 24 is not grown in the vertical direction and is grown only in the lateral direction. The dislocations 37 in the underlying GaN layer 23 are not propagated to the GaN layer 24 which is grown in the lateral direction on the $SiO_2$ films 30.

As shown in FIG. 10(g), as the GaN layer 24 is regrown, the $SiO_2$ films 30 on the lower step of the irregular pattern are filled in with the GaN layer 24. The GaN layer 24 is grown in the vertical direction.

Thereafter, as shown in FIG. 10(h), the GaN layer 24 is grown in the lateral direction as well as the vertical direction on the $SiO_2$ films 30 on the upper step of the irregular pattern. Accordingly, the surface of the GaN layer 24 is flattened. Consequently, the GaN layer 24 of high quality having no dislocations is formed on the $SiO_2$ films 30 on the irregular pattern.

In order to flatten the surface of the GaN layer 24 which is regrown, the GaN layer 24 must have a certain degree of thickness. The thickness required to flatten the surface of the GaN layer 24 differs depending on the growth conditions such as the width of the irregular pattern on the underlying GaN layer 23 and the substrate temperature at the time of the growth of the GaN layer 24. For example, when the respective widths of the recess and the projection in the irregular pattern are approximately 5 µm, the thickness of the GaN layer 24 must be approximately 10 to 20 µm.

GaN is easily grown in a <1$\bar{1}$00> direction. In order that the GaN layer 24 is easily grown in the lateral direction in the steps shown in FIGS. 10(f), 10(g), and 10(h), therefore, it is desirable that the striped masks 29 composed of Ni are formed in a <11$\bar{2}$0> direction perpendicular to the <1$\bar{1}$00> direction of the GaN layer 23 in the step shown in FIG. 9(c).

In order that the surface of the GaN layer 24 which is regrown in the step shown in FIG. 10(h) is easily flattened, the mask width of the striped masks 29 composed of Ni and the window width of the striped masks 29 (the width of a region where no Ni exists) which are used in the step shown in FIG. 9(c) are preferably as small as not more than 10 μm, and more preferably 1 to 5 μm.

Furthermore, it is preferable that a cross-sectional shape of the projection in the irregular pattern on the underlying GaN layer 23 is a rectangular shape or a reversed mesa shape (reversed trapezoidal shape) having vertical side surfaces rather than a mesa shape (trapezoidal shape).

Figure 11:
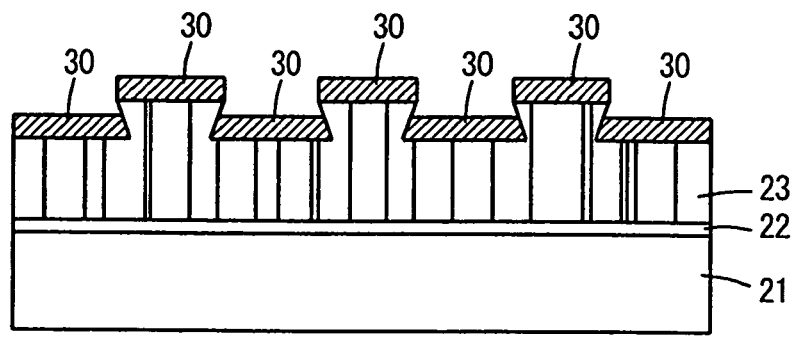
FIG. 11 is a schematic sectional view showing an irregular pattern in a reversed mesa shape formed on the surface of a GaN layer.

As shown in FIG. 11, the cross sectional shape of the irregular pattern on the GaN layer 23 is a reversed mesa shape, and the $SiO_2$ films 30 are formed on the GaN layer 23 by a deposition method, such as electron beam evaporation, inferior in step coverage, thereby making it possible to prevent the $SiO_2$ films 30 from being deposited on the side surfaces of the irregular pattern. Consequently, it is possible to omit the step of removing the $SiO_2$ films 30 on the side surfaces of the irregular pattern by etching.

Figure 12:
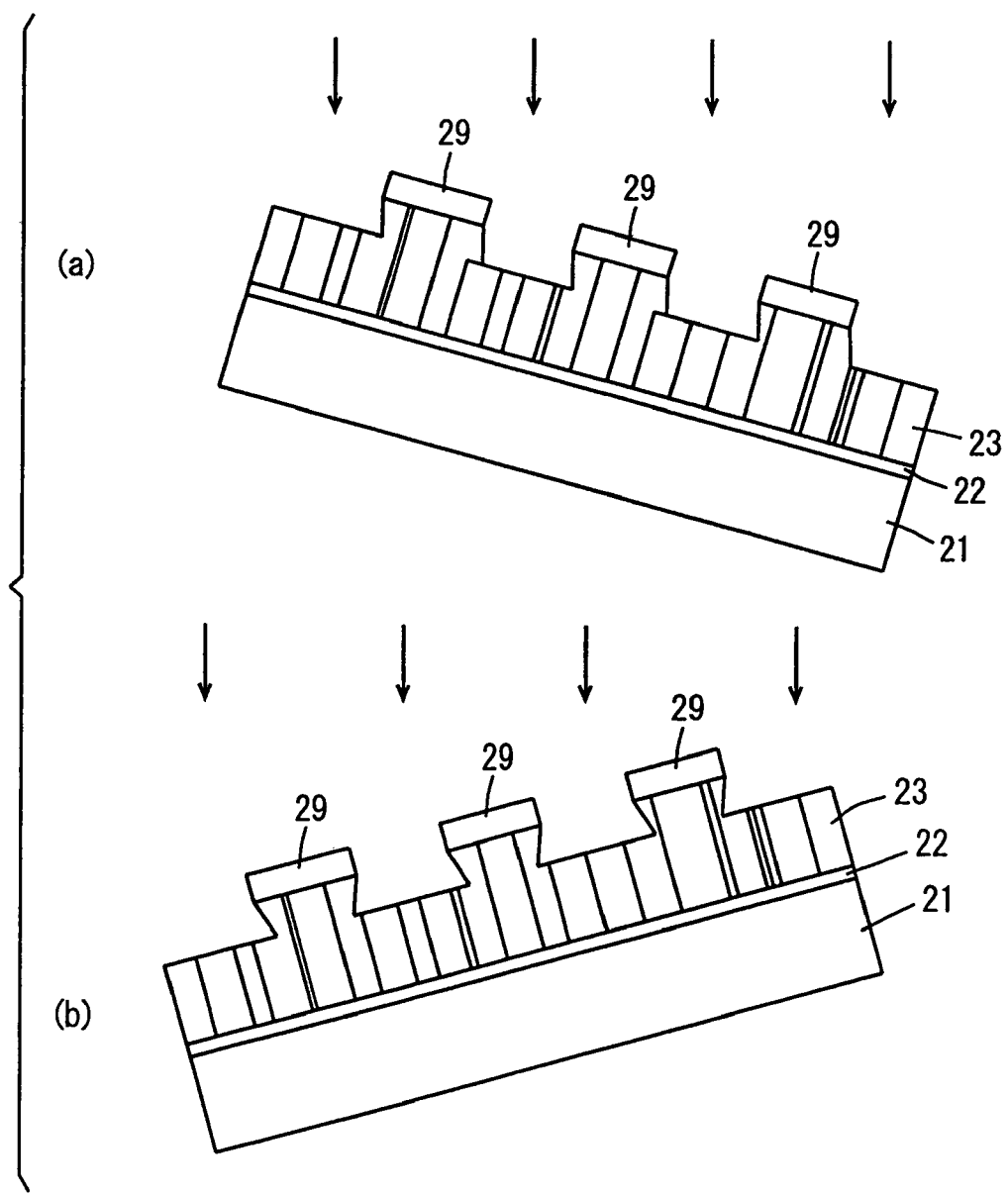
FIG. 12 is a schematic sectional view showing a method of forming the irregular pattern in a reversed mesa shape on the surface of the GaN layer.

FIGS. 12(a) and 12(b) are schematic sectional views showing a method of forming the irregular pattern in a reversed mesa shape on the surface of the underlying GaN layer 23.

As shown in FIG. 12(a), the striped masks 29 composed of Ni are formed on the GaN layer 23, and the sapphire substrate 21 is then inclined and is mounted on an etching apparatus at the time of dry etching. In this state, the GaN layer 23 is etched by dry etching such as RIE.

As shown in FIG. 12(b), the sapphire substrate 21 is inclined in the reverse direction. In this state, the GaN layer 23 is etched by dry etching such as RIE. The irregular pattern in the reversed mesa shape can be thus formed on the surface of the GaN layer 23.

According to the method of fabricating the GaN based semiconductor layer in the present embodiment, it is possible to grow, even if the sapphire substrate 21 which differs in lattice constant from GaN, the GaN layer 24 of high quality having no dislocations on the entire surface of the sapphire substrate 21.

When a light emitting semiconductor device such as a light emitting diode or a semiconductor laser device composed of a GaN based semiconductor layer is fabricated on the GaN layer 24, it is possible to improve light output power-current characteristic and reliability.

Although in the example shown in FIGS. 9 and 10, the sapphire substrate 21 is used as an insulating substrate, the sapphire substrate 21 can be also replaced with another insulating substrate such as an SiC substrate or a spinel ($MgAl_2O_4$) substrate.

FIG. 13 is a schematic sectional view showing an example of a semiconductor laser device fabricated on the GaN layer formed by the method shown in FIGS. 9 and 10.

In FIG. 13, an n-GaN layer 25, an n-InGaN crack preventing layer 26, an n-AlGaN cladding layer 27, an MQW active layer 28, and a p-AlGaN cladding layer 29 are formed in this order on a GaN layer 24 formed by the method shown in FIGS. 9 and 10. An n-AlGaN current blocking layer 31 is formed except in striped regions on the p-AlGaN cladding layer 29. A p-AlGaN cladding layer 32 and a p-GaN contact layer 33 are formed in this order on the p-AlGaN cladding layer 29 and the n-AlGaN current blocking layer 31. A partial region from the p-GaN contact layer 33 to the n-GaN layer 25 is removed by etching. A p electrode 34 is formed on the p-GaN contact layer 33, and an n electrode 35 is formed on the exposed surface of the n-GaN layer 25.

In the semiconductor laser device shown in FIG. 13, a GaN based semiconductor layer 36 from the n-GaN layer 25 to the p-GaN contact layer 33 is formed on the GaN layer 24 having no dislocations. Accordingly, few dislocations exist in the GaN based semiconductor layer 36. Consequently, a semiconductor laser device capable of a low-current operation and a low-voltage operation is obtained.

Although in the present embodiment, description was made of a case where the method of forming the nitride based semiconductor layer according to the present invention is applied to the semiconductor laser device, the method of forming the nitride based semiconductor layer according to the present invention is also applicable to light emitting semiconductor devices such as a light emitting diode and the other semiconductor devices.

Figure 14:
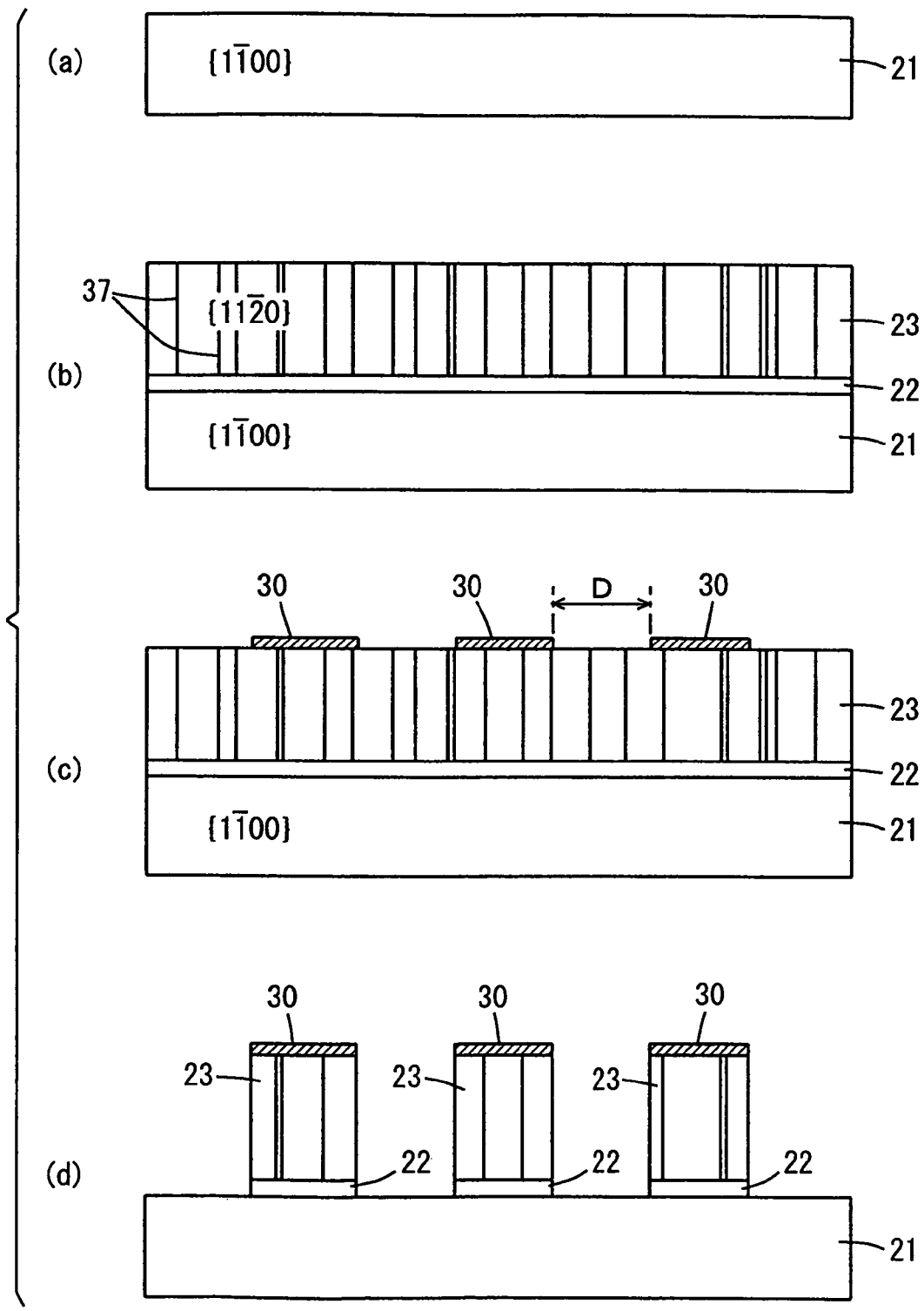
FIG. 14 is a schematic sectional view showing the steps in another example of a method of forming a GaN based semiconductor layer.
Figure 15:
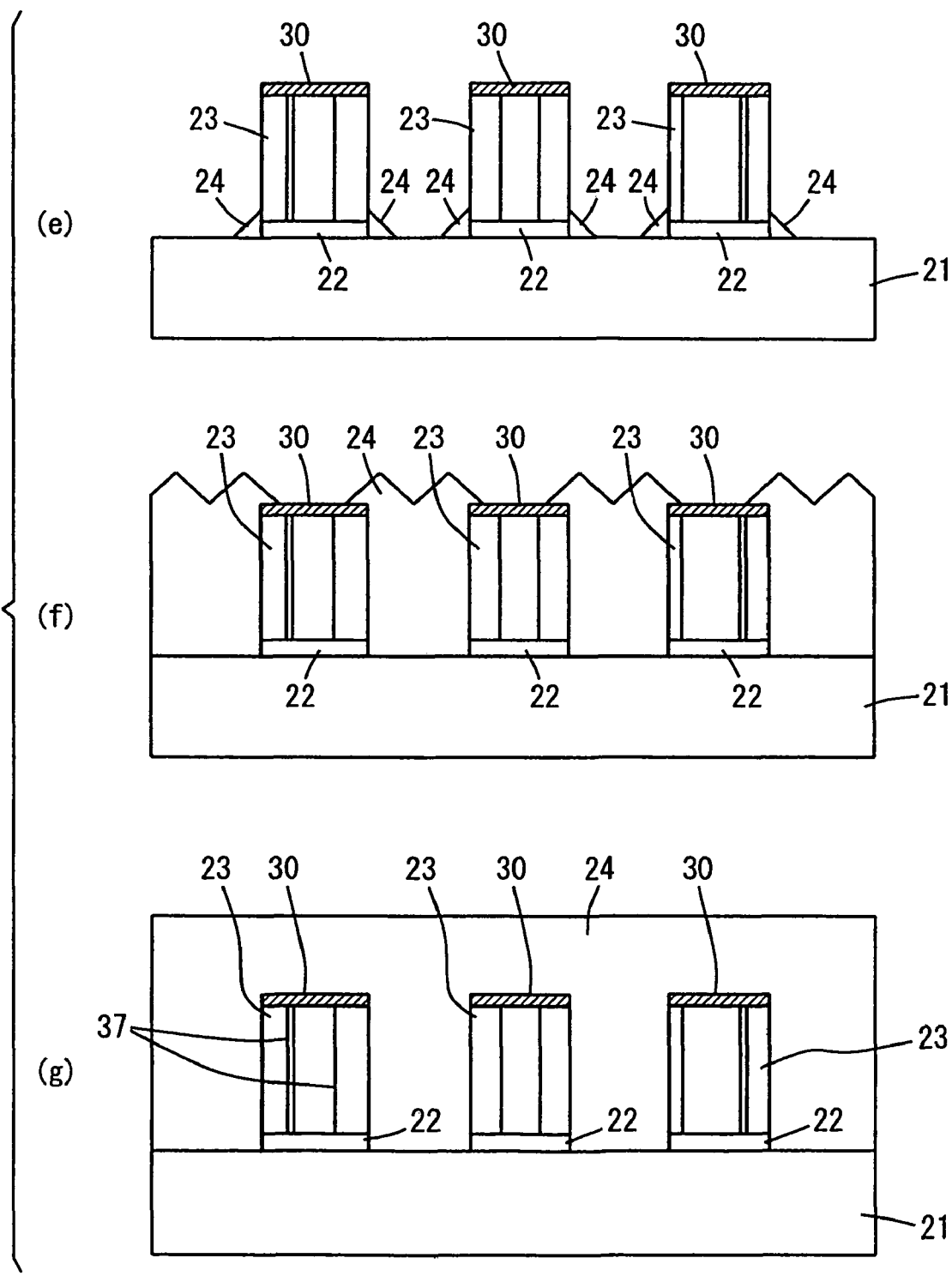
FIG. 15 is a schematic sectional view showing the steps in another example of the method of forming the GaN based semiconductor layer.

Although in the example shown in FIGS. 9 and 10, the GaN layer 23 is etched such that it remains on the bottom surfaces of the recesses in forming the striped irregular pattern on the surface of the GaN layer 23, the GaN layer 23 may be etched until the sapphire substrate 21 is exposed to the bottom surfaces of the recesses, as shown in FIGS. 14 and 15, in forming the irregular pattern on the surface of the GaN layer 23.

Figure 19:
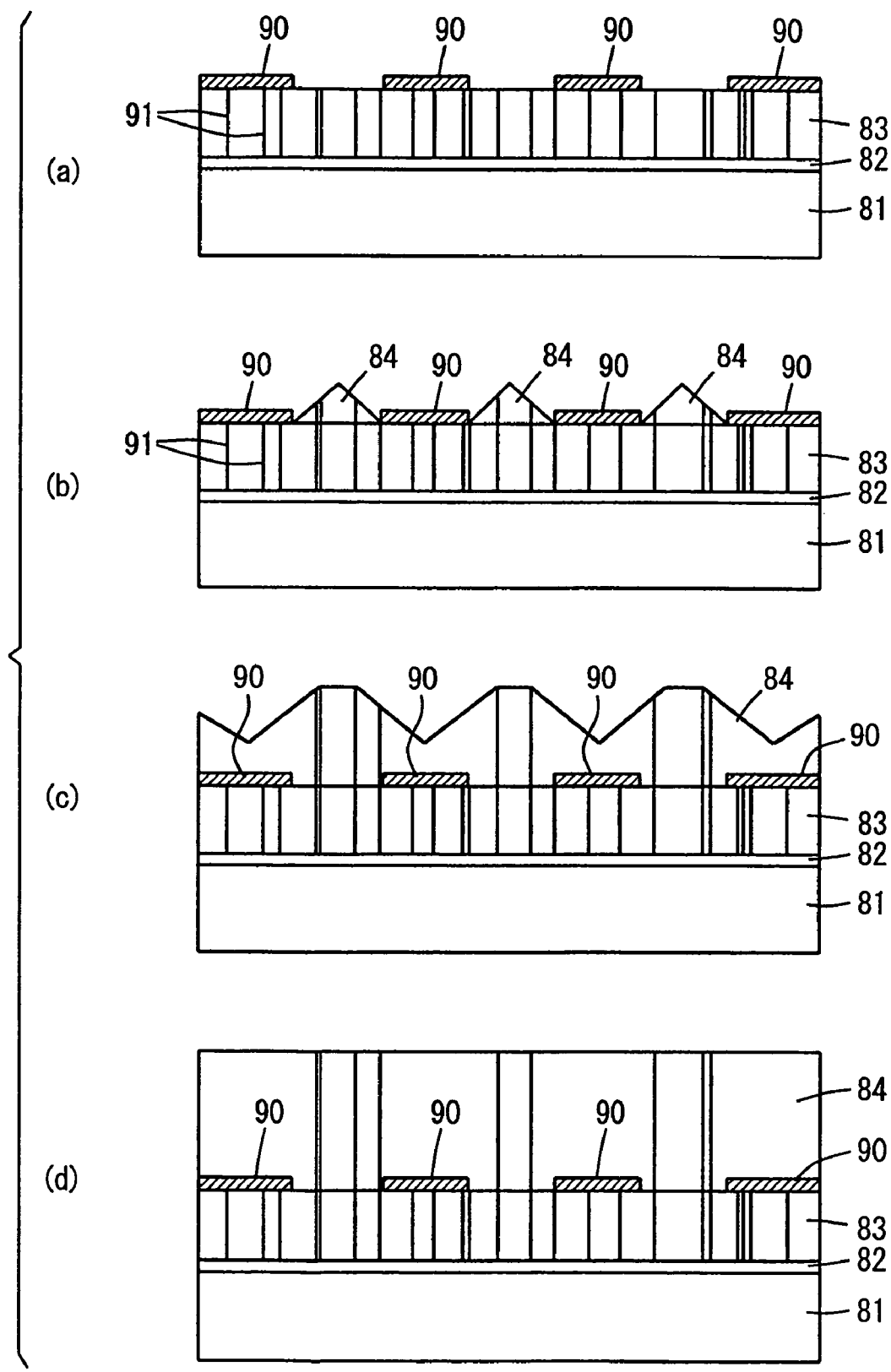
FIG. 19 is a schematic sectional view showing the steps of a conventional method of forming a GaN based semiconductor layer using epitaxial lateral overgrowth.
Figure 20:
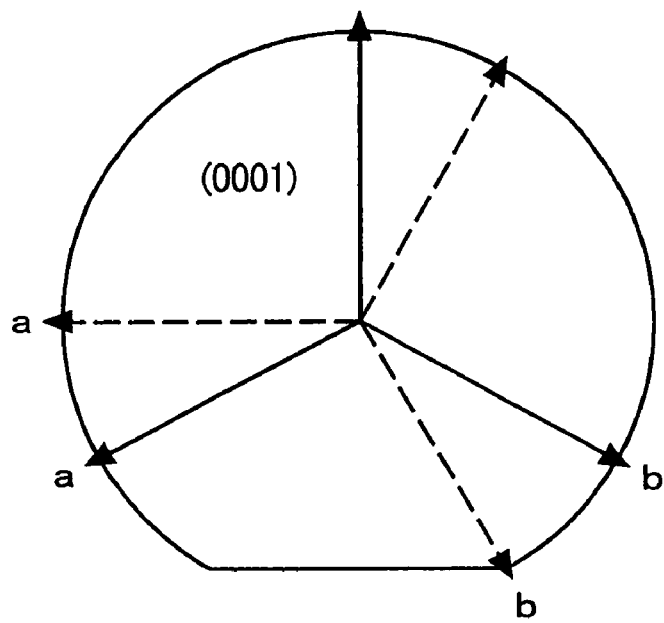
FIG. 20 is a diagram showing the relationship between the crystal orientations of a sapphire substrate and a GaN based semiconductor layer formed thereon.
Figure 21:
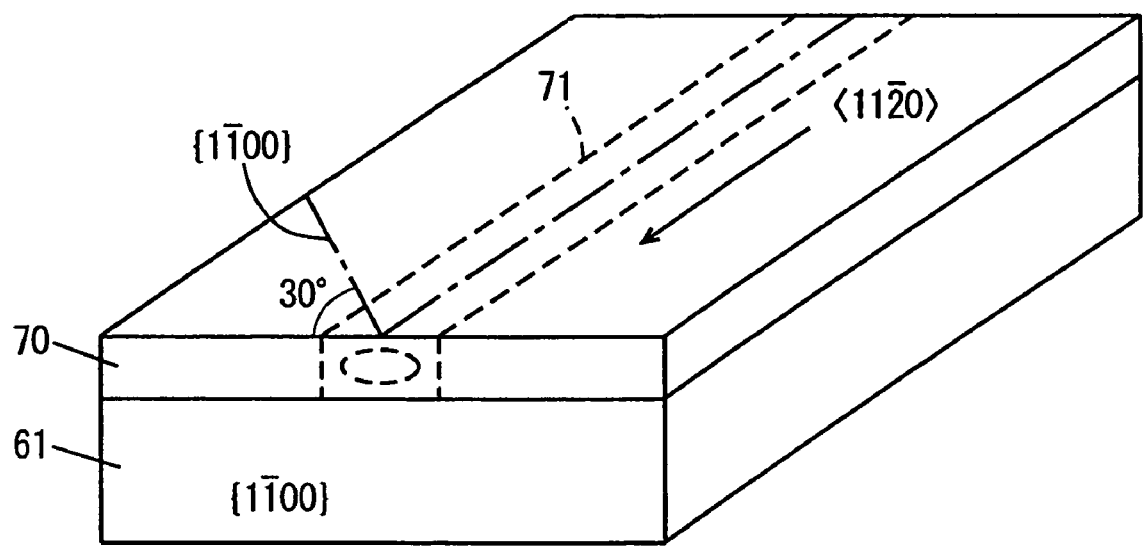
FIG. 21 is a diagram showing the relationship between the crystal orientations of the sapphire substrate and the GaN based semiconductor layer formed thereon.

As shown in FIGS. 14(a) and 14(b), an AlGaN buffer layer 22 and an undoped GaN layer 23 are successively grown on a (0001) plane of a sapphire substrate 21, as in FIGS. 19(a) and 19(b). The thickness of the GaN layer 23 is approximately 0.5 μm to 5 μm, for example. Also in this case, dislocations 37 extending in the vertical direction exist in the GaN layer 23.

An $SiO_2$ film is, then formed on the entire surface of the GaN layer 23, and striped masks composed of photoresist are formed on the $SiO_2$ film. The $SiO_2$ film is etched using a hydrofluoric acid, to form striped $SiO_2$ films 30, as shown in FIG. 14(c).

Thereafter, as shown in FIG. 14(d), the GaN layer 23 and the AlGaN buffer layer 22 are etched until the sapphire substrate 21 is exposed using the $SiO_2$ films 30 as masks and by RIE using chlorine gas, to form a striped irregular pattern on the surface of the GaN layer 23. The respective widths D of a recess and a projection in the irregular pattern shall be 5 μm, for example.

Thereafter, as shown in FIG. 15(e), the GaN layer 24 is regrown. At this time, the underlying GaN layer 23 is exposed only to the side surfaces of the irregular pattern. When the regrowth of the GaN layer 24 is started, therefore, the GaN layer 24 is not grown in the vertical direction and is grown only in the lateral direction. No dislocations exist in the GaN layer 24 which is grown in the lateral direction on the sapphire substrate 21.

As shown in FIG. 15(f), as the GaN layer 24 is regrown, the recesses in the irregular pattern are filled in with the GaN layer 24. The GaN layer 24 is grown in the vertical direction.

Thereafter, as shown in FIG. 15(g), the GaN layer 24 is grown in the lateral direction as well as the vertical direction on the $SiO_2$ films 30 on the top surfaces of the projections in the irregular pattern. Accordingly, the surface of the GaN layer 24 is flattened. Consequently, the GaN layer 24 of high quality having no dislocations is formed on the $SiO_2$ films 30 on the irregular pattern and the sapphire substrate 21.

As in the example shown in FIGS. 9 and 10, in order to flatten the surface of the GaN layer 24 which is regrown, the GaN layer 24 must have a certain degree of thickness. The thickness required to flatten the surface of the GaN layer 24 differs depending on the growth conditions such as the width of the irregular pattern on the underlying GaN layer 23 and the substrate temperature at the time of the growth of the GaN layer 24. For example, when the respective widths of the recess and the projection in the irregular pattern are 5 μm, the thickness of the GaN layer 24 must be approximately 10 to 20 μm.

GaN is easily grown in a <1$\bar{1}$00> direction. In order that the GaN layer 24 is easily grown in the lateral direction in the steps shown in FIGS. 15(e), 15(f), and 15(g), therefore, it is desirable that the striped SiO₂ films 30 are formed in a <11$\bar{2}$0> direction perpendicular to the <1$\bar{1}$00> direction of the GaN layer 23 in the step shown in FIG. 4(c).

Furthermore, in order that the surface of the GaN layer 24 which is regrown in the step shown in FIG. 15(g) is easily flattened, the width of each of the striped SiO₂ films 30 formed in the step shown in FIG. 14(c) and the window width of the striped SiO₂ films 30 (the width of a region where the SiO₂ films do not exist) are preferably as small as not more than 10 µm, and more preferably not more than 1 to 5 µm.

It is preferable that a cross-sectional shape of the projection in the irregular pattern on the GaN layer 23 is a rectangular shape or a reversed mesa shape having vertical side surfaces rather than a mesa shape, as in the example shown in FIGS. 9 and 10.

Although in the example shown in FIGS. 14 and 15, the sapphire substrate 21 is used as an insulating substrate, the sapphire substrate 21 may be also replaced with another insulating substrate such as a spinel substrate.

Figure 17:
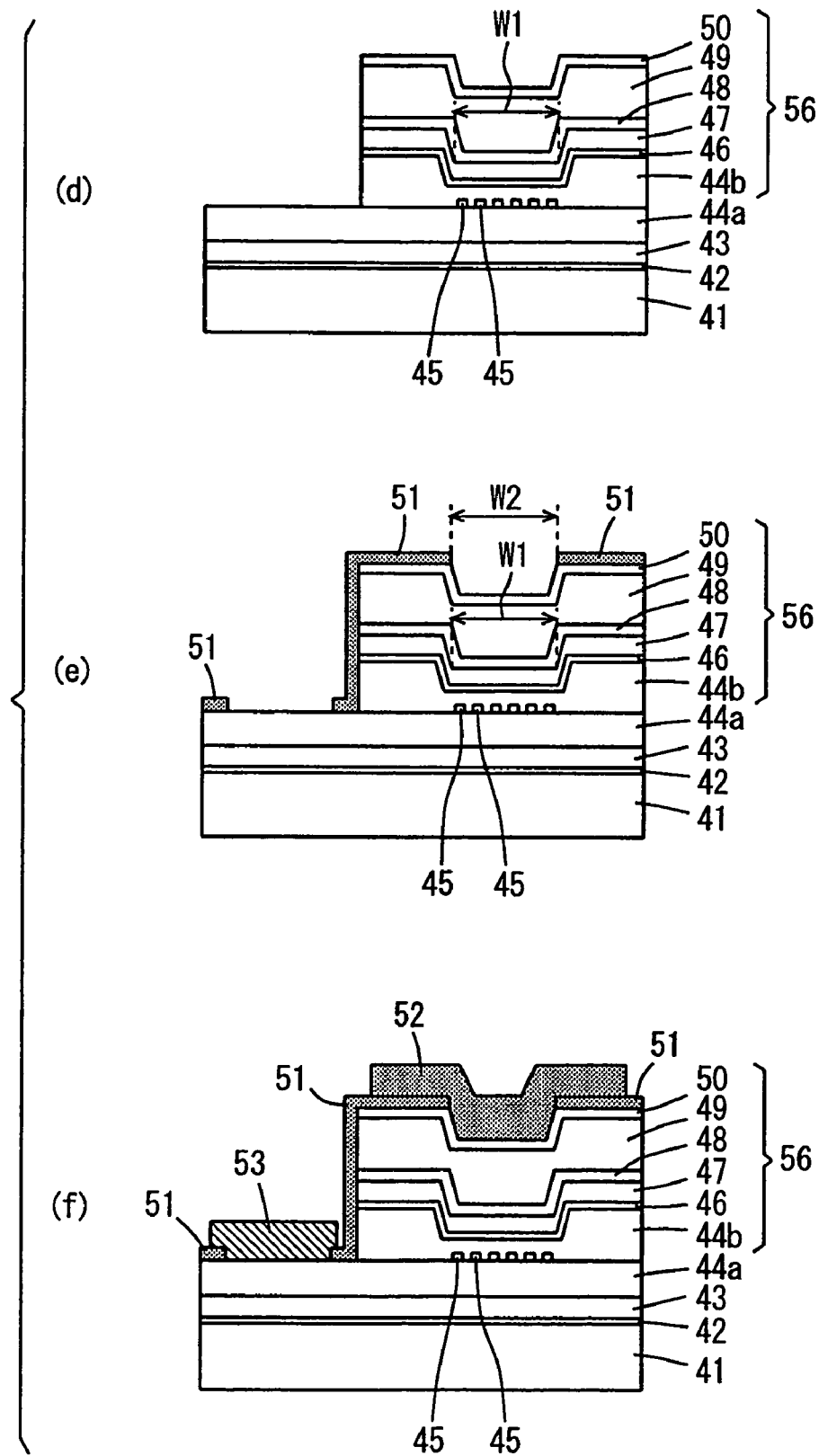
FIG. 17 is a schematic sectional view showing the steps of the method of fabricating the semiconductor laser device in the third embodiment of the present invention.
Figure 18:
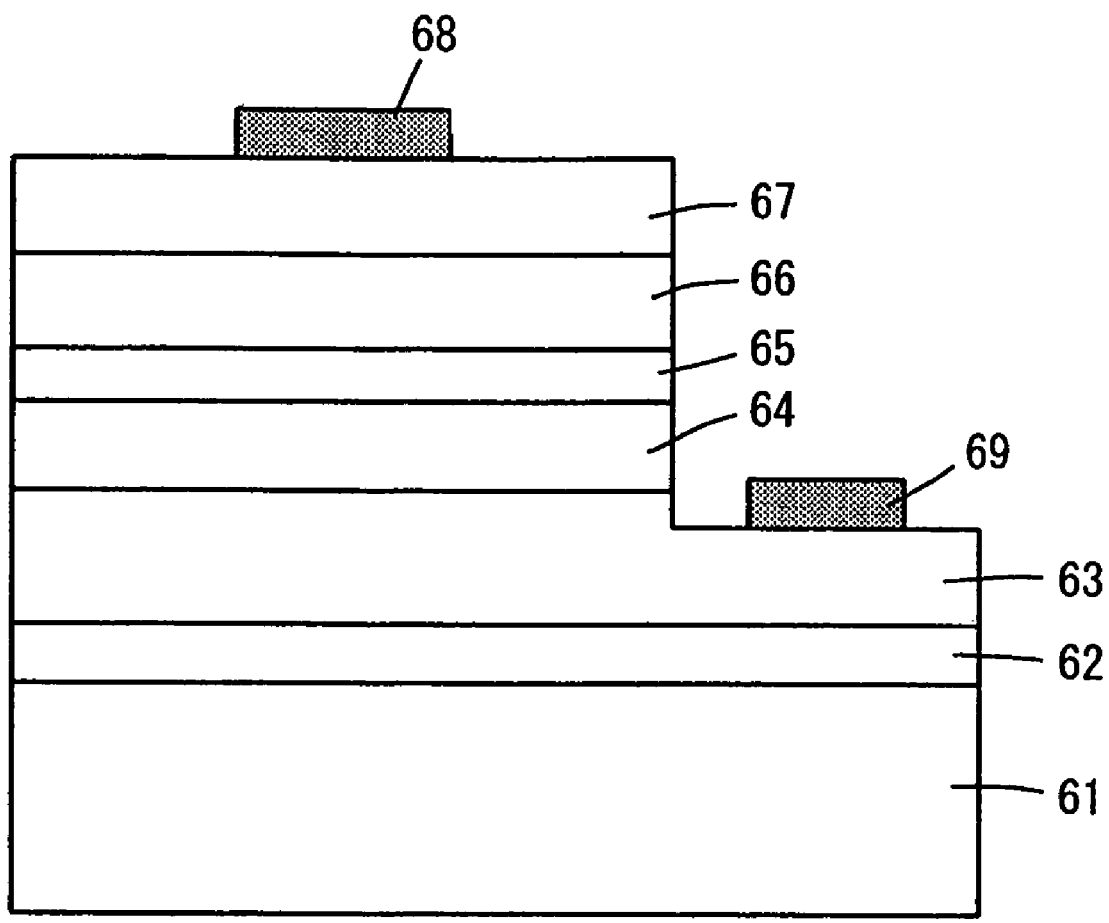
FIG. 18 is a schematic sectional view of a conventional GaN based light emitting diode.

FIGS. 16 and 17 are schematic sectional views showing the steps of a method of fabricating a semiconductor laser device in a third embodiment of the present invention.

As shown in FIG. 16(a), an AlGaN buffer layer 42 having a thickness of 30 Å, an undoped GaN layer 43 having a thickness of 2 µm, and an Si doped n-GaN layer 44a having a thickness of 3 µm are grown in this order on a (0001) plane of a sapphire substrate 41.

As shown in FIG. 16(b), an SiO₂ film having a thickness of approximately 1000 Å is then formed on the n-GaN layer 44a. The SiO₂ film in a region excluding a light emitting portion is then removed by etching, and the SiO₂ film in a region corresponding to the light emitting portion is patterned in a stripe shape, to form a plurality of striped SiO₂ films 45. In this case, the striped SiO₂ films 45 are formed in a <1$\bar{1}$20> direction of the n-GaN layer 44a such that GaN is easily grown in the lateral direction in the subsequent step.

The width of each of the striped SiO₂ films 45 is approximately 0.5 µm, and a pitch between the striped SiO₂ films 45 is approximately 1 µm. In order to realize fundamental transverse mode lasing, the width W1 of the light emitting portion is preferably about 2 to 5 µm, and the number of the striped SiO₂ films 45 must be approximately 3 to 5.

Thereafter, as shown in FIG. 16(c), an Si doped n-GaN layer 44b having a thickness of 5 µm, an Si doped n-InGaN crack preventing layer 46 having a thickness of 0.1 µm, and an Si doped n-AlGaN cladding layer 47 having a thickness of 1 µm are grown in this order on the n-GaN layer 44a. Further, an MQW active layer 48 having the structure shown in FIG. 7, an Mg doped p-AlGaN cladding layer 49 having a thickness of 1 µm, and an Mg doped p-GaN contact layer 50 having a thickness of 0.1 µm are grown in this order on the n-AlGaN cladding layer 47.

In this case, in a region where the striped SiO₂ films 45 exist, GaN is grown in the vertical direction from the underlying n-GaN layer 44a between the striped SiO₂ films 45, and GaN is then grown in the lateral direction on the striped SiO₂ films 45. On the other hand, in a region where the striped SiO₂ films 45 do not exist, GaN is grown in the vertical direction from the underlying n-GaN layer 44a. Consequently, a difference substantially arises in the growth rate of GaN between the region where the striped SiO₂ films 45 exist and the region where the striped SiO₂ films 45 do not exist. That is, in the region where the striped SiO₂ films 45 exist, the growth rate of GaN is substantially lower, as compared with that in the region where the striped SiO₂ films 45 do not exist. The difference in the growth rate is continued until the striped SiO₂ films 45 are completely filled in with GaN so that the growth in the lateral direction is completed.

As a result, the surface of the n-GaN layer 44b is concavely formed. Further, the n-InGaN crack preventing layer 46, the n-AlGaN cladding layer 47, the MQW active layer 48, the p-AlGaN cladding layer 49, and the p-GaN contact layer 50 are concavely formed. A concave part of the MQW active layer 48 is a light emitting portion which is an active region of the device. Further, few crystal defects exist in a GaN based semiconductor layer 56 on the region where the striped SiO₂ films 45 exist.

Thereafter, as shown in FIG. 17(d), a partial region from the p-GaN contact layer 50 to the n-GaN layer 44b is removed by etching, to expose the n-GaN layer 44a.

Furthermore, as shown in FIG. 17(e), an SiO₂ film 51 is formed on the top surface and side surfaces of the p-GaN contact layer 50 and the top surface of the n-GaN layer 44a in order to narrow a current and protect an exposed portion of a pn junction except in a region above the light emitting portion and an electrode forming region of the n-GaN layer 44a.

Finally, as shown in FIG. 17(f), a p electrode 52 is formed on the exposed surface of the p-GaN contact layer 50, and an n electrode 53 is formed on the exposed surface of the n-GaN layer 44a.

In order that a current is not uselessly injected into the light emitting portion, it is preferable that the window width W2 of the SiO₂ film 51 to be a current injection region is made equal to or slightly smaller than the width W1 of the light emitting portion.

In a method of fabricating the semiconductor laser device according to the present embodiment, the crystallizability of a GaN based semiconductor layer 56 on the region where the striped SiO₂ films 45 exist, and the MQW active layer 48 in the light emitting portion is concavely formed by a difference in the growth rate which arises during the growth in the lateral direction of GaN.

Consequently, a difference in the index of refraction appears in not only the vertical direction but also the horizontal direction of the sapphire substrate 41. As a result, it is possible to easily fabricate a refractive index guided structure by performing crystal growth twice without carrying out the etching step. Consequently, a refractive index guided semiconductor laser device which is uniform in device characteristics and is high in reproducibility is realized.

Although in the present embodiment, description was made of a case where the present invention is applied to the semiconductor laser device, the present invention is also applicable to light emitting semiconductor devices such as a light emitting diode and the other semiconductor devices.

Although in the third embodiment, description was made of the semiconductor laser device using the sapphire substrate 41, it is possible to use substrates such as an SiC substrate and a spinel (MgAl₂O₄) substrate in place of the sapphire substrate 41.

Although in the above-mentioned first, second and third embodiments, the SiO₂ films 4, 30, and, 45 are used as insulating films for carrying out epitaxial lateral overgrowth, the SiO₂ film may be replaced with other insulating films such as an Al₂O₃ film and a TiO₂ film.

Although in the above-mentioned first, second and third embodiments, the nitride based semiconductor layer contains Ga, Al, and In, the nitride based semiconductor layer may contain boron (B).

Although the present invention has been described and illustrated in detail, it is clearly understood that the same is by way of illustration and example only and is not to be taken by way of limitation, the spirit and scope of the present invention being limited only by the terms of the appended claims.

The invention claimed is:

1. A semiconductor device comprising:
   a substrate;
   a first electrode layer formed on said substrate;
   a nitride based semiconductor layer formed on said first electrode layer and containing at least one of boron, gallium, aluminum and indium;
   a second electrode layer formed on said nitride based semiconductor layer; and
   a film for preventing short formed on a side surface of said nitride based semiconductor layer and said first electrode.

2. The semiconductor device according to claim 1, wherein said nitride based semiconductor layer includes an active layer.

3. The semiconductor device according to claim 2, wherein said nitride based semiconductor layer has a striped current injection region for injecting a current into said active layer, said striped current injection region being formed along a $<1\bar{1}00>$ direction of said nitride based semiconductor layer.

4. The semiconductor device according to claim 3, wherein said semiconductor device has a pair of cavity facets, said cavity facet having a $\{1\bar{1}00\}$ plane of said nitride based semiconductor layer.

5. The semiconductor device according to claim 1, wherein said film is composed of $SiO_2$.

6. The semiconductor device according to claim 1, wherein said second electrode layer is formed on said film.

7. The semiconductor device according to claim 6, wherein said second electrode layer is formed on said film on said first electrode.

8. The semiconductor device according to claim 1, wherein an Au—Sn film is formed on said substrate, and said first electrode layer formed on said Au—Sn film.

* * * * *